US012772582B2

(12) United States Patent
Zheng et al.

(10) Patent No.: US 12,772,582 B2
(45) Date of Patent: Oct. 20, 2026

(54) IMAGE SENSOR WITH SHARED GATE ARCHITECTURE FOR METAL LAYER REDUCTION

(71) Applicant: OMNIVISION TECHNOLOGIES, INC., Santa Clara, CA (US)

(72) Inventors: Yaxin Zheng, Santa Clara, CA (US); Takayuki Goto, Foster City, CA (US); Rui Wang, San Jose, CA (US); Kazufumi Watanabe, Mountain View, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 540 days.

(21) Appl. No.: 18/204,261

(22) Filed: May 31, 2023

(65) Prior Publication Data

US 2024/0405039 A1 Dec. 5, 2024

(51) Int. Cl.
*H10F 39/00* (2025.01)

(52) U.S. Cl.
CPC ..... *H10F 39/80373* (2025.01); *H10F 39/809* (2025.01); *H10F 39/811* (2025.01)

(58) Field of Classification Search
CPC ............. H10F 39/80373; H10F 39/809; H10F 39/811; H10F 39/18; H10F 39/8037; H10F 39/807; H10F 39/813
See application file for complete search history.

(56) References Cited

U.S. PATENT DOCUMENTS 7,323,754 B2 1/2008 Ema et al.
9,025,063 B2 5/2015 Ahn et al.
9,165,959 B2 10/2015 Chen et al.
10,070,081 B2 9/2018 Mo et al.
10,103,190 B2 10/2018 Korobov et al.
10,438,989 B2 10/2019 Kim et al.
11,133,255 B2 9/2021 Peng et al.
(Continued)

FOREIGN PATENT DOCUMENTS

EP 3886144 A1 9/2021
WO 2020105713 A1 10/2021

OTHER PUBLICATIONS

U.S. Appl. No. 17/886,945, filed Aug. 12, 2022, 75 pages.
(Continued)

*Primary Examiner* — Fernando L Toledo
*Assistant Examiner* — Marshall Mu-Nuo Hatfield
(74) *Attorney, Agent, or Firm* — Christensen O'Connor Johnson Kindness PLLC

(57) ABSTRACT

An image sensor comprising a semiconductor substrate, a first source region, a second source region, and a shared gate electrode is described. The semiconductor substrate includes a first side and a second side opposite the first side. The first source region and the second source region are each disposed within the semiconductor substrate proximate to the first side. The first source region is separated from the second source region by an isolation structure disposed within the semiconductor substrate between the first source region and the second source region. The shared gate electrode is disposed proximate to the first side of the semiconductor substrate and coupled to the first source region and the second source region to respectively form a first transistor and a second transistor.

18 Claims, 12 Drawing Sheets

(56) References Cited

U.S. PATENT DOCUMENTS

| | | | | |
|---|---|---|---|---|
| 2007/0152285 | A1 | 7/2007 | Lim | |
| 2010/0097508 | A1* | 4/2010 | Yanagita | H04N 25/621 348/301 |
| 2017/0347047 | A1* | 11/2017 | Mao | H04N 25/59 |
| 2020/0119082 | A1* | 4/2020 | Lee | H10F 39/153 |
| 2020/0243590 | A1 | 7/2020 | Yamagishi et al. | |
| 2021/0074747 | A1* | 3/2021 | Takahashi | H10F 39/802 |
| 2021/0082983 | A1 | 3/2021 | Kadura et al. | |
| 2021/0358994 | A1 | 11/2021 | Lee et al. | |
| 2021/0360175 | A1 | 11/2021 | Dai et al. | |
| 2021/0400224 | A1 | 12/2021 | Gocho et al. | |
| 2022/0052084 | A1* | 2/2022 | Jang | H10F 39/807 |
| 2024/0243151 | A1* | 7/2024 | Kim | H10F 39/80373 |
| 2024/0250103 | A1* | 7/2024 | Kim | H10F 39/8063 |

OTHER PUBLICATIONS

U.S. Appl. No. 17/886,955, filed Aug. 12, 2022, 91 pages.

Venezia et al., Second Generation Small Pixel Technology Using Hybrid Bond Stacking, Sensors, 2018, www.mdpi.com/journal/sensors.

Venezia et al., 1.5μm Dual Conversion Gain, Backside Illuminated Image Sensor Using Stacked Pixel Level Connections with 13ke-Full-Well Capacitance and 0.8e-Noise, 2018, IEEE International Electron Devices Meeting.

U.S. Appl. No. 18/051,437, filed Oct. 31, 2022, 63 pages.

U.S. Appl. No. 18/051,351, filed Oct. 31, 2022, 86 pages.

* cited by examiner

101-ZZ'

185

IMAGE SENSOR WITH SHARED GATE ARCHITECTURE FOR METAL LAYER REDUCTION

TECHNICAL FIELD

This disclosure relates generally to image sensors, and in particular but not exclusively, relates to stacked CMOS image sensors and applications thereof.

BACKGROUND INFORMATION

Image sensors are one type of semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, size, etc.) through both device architecture design as well as image acquisition processing. However, it is appreciated that many of these metrics are inversely related. For example, pixel size may be increased to improve dynamic range but have increased noise. In another example, resolution may be increased by increasing the number of pixels, but if pixel size is maintained then the physical size of the image sensor increases. Accordingly, improving one or more performance metrics of semiconductor devices such as image sensors while mitigating adverse effects on other performance metrics remains challenging.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale; emphasis instead being placed upon illustrating the principles being described.

DETAILED DESCRIPTION

Figure 1A:
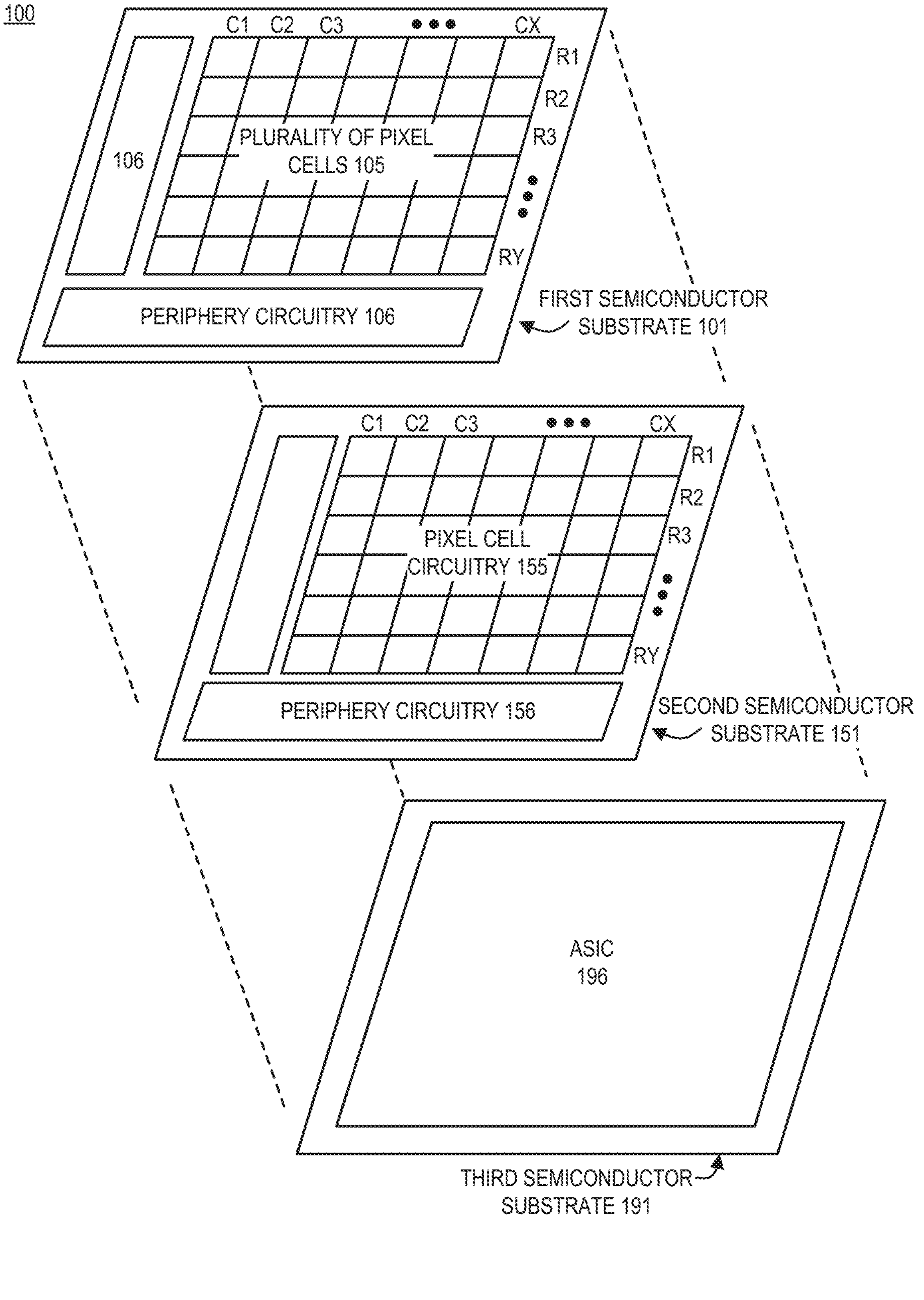
FIG. 1A illustrates an example of a stacked semiconductor device corresponding to an imaging system, in accordance with embodiments of the disclosure.

Embodiments of an apparatus, system, and/or method related to an image sensor with shared gate architecture for metal layer reduction and metal layer utilization improvement are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors with small-pixel layouts (e.g., submicron pixel pitch) face manufacturing space constraints. For example, it may be difficult to meet the design rules of a given processing node set by a manufacturing foundry, which risks process variation during fabrication. Process variation may correspond to variation in oxide thickness, dopant fluctuations, and variance in structure geometry and location. It is appreciated that structure geometry relates to length, width, and height of one or more components that form or are otherwise included in a given image sensor. In image sensors with small-pixel layouts, these variations can constitute a significant percentage of a given pixel, which may cause pixel and circuit performance abnormalities that may lead to production yield loss, performance degradation, or otherwise have a negative impact on image sensor performance.

One way to facilitate fabrication of small-pixel layouts is to employ a stacked chip scheme (e.g., a stacked semiconductor device that utilizes multiple semiconductor substrates or wafers) to conserve space by distributing components of the image sensor across multiple semiconductor substrates. In such a way, components may be offloaded to different substrates and occupancy area or fill factor of photodiodes and/or other components of the image sensor may be increased. In other words, lateral space on or in a given substrate may be more efficiently utilized. Additionally, the overall lateral space available within the image sensor package may be increased by utilizing a stacked chip scheme. However, it is appreciated that manufacturing costs of an image sensor with a stacked chip scheme may be appreciably affected since more masks and processing steps are necessary to fabricate the device. Accordingly, the issues of variance and cost may hinder the development and adoption of image sensors with small-pixel layouts and there is a need for a solution to reduce unit pixel space and cost.

Embodiments described herein employ a stacked chip scheme with a layout that enables a submicron pixel pitch, reduces fabrication costs, and further mitigates processing variance by being able to meet design rules of a given processing node set by a manufacturing foundry (e.g., 45 nm technology node). This is achieved, at least in part, by arranging components of pixel cell circuitry (e.g., transistor and other circuitry elements for pixel operation and readout) in a manner such that gate electrodes may be shared across adjacent transistors and/or threshold voltage implant areas may be shared across adjacent transistors. In some embodiments, this is achieved by a shared polysilicon (or other conductive material) architecture formed in or on a given semiconductor substrate that functions as local routing (e.g., in lieu of internal metal interconnects). As a result, the required metal layers for the image sensor may be decremented by at least one, which enables greater routing flexibility of metal layers, conserves space, and reduces fabrication cost. For example, a "metal 1" layer may correspond to the closest metallization layer to an active region of a semiconductor substrate and typically be utilized for internal routing (e.g., using metal lines or wires and contact vias disposed within an intermetal dielectric layer) to couple individual components (e.g., transistors). However, in embodiments of the disclosure, transistor source/drain regions are arranged to be sufficiently close that polycrystalline silicon (i.e., polysilicon) or other conductive materials may be utilized to form shared gate electrodes of transistors. In other words, instead of forming two separate transistors and then coupling them together using one or more metal layers (e.g., coupling a first gate electrode of a first transistor to a second gate electrode of a second transistor via one or more metal wires and/or contact vias), the transistors may be coupled together at the component level (e.g., a shared gate electrode extends over the active regions of both the first and second transistor). In such embodiment, the shared gate electrode may be formed as a monolithic structure. Accordingly, shared gate electrodes of transistors formed using polycrystalline silicon (i.e., polysilicon) or other conductive materials in embodiments of the disclosure may provide internal routing functionality that may displace the need of using the aforementioned "metal 1" layer for pixel circuit component via contact routing (i.e., internal routing) employed by conventional image sensors. Such embodiments advantageously facilitate reduced fabrication cost and routing flexibility.

In some embodiments, this may be achieved by sharing gate electrodes between adjacent transistors. In the same or other embodiments, source and/or drain regions of adjacent transistors are coupled together by using a common junction formed in the semiconductor substrate. In the same or other embodiments, transistors are arranged to form a small-pixel layout in which threshold voltage implant areas (e.g., doped areas for controlling threshold voltage of transistors) are shared by multiple transistors across separate and adjacently disposed 4C pixel cells. In the same or other embodiments, oxide defined regions (e.g., areas in or on the semiconductor substrate defined by shallow trench isolation structures, deep trench isolation structures, other isolation structures, or combinations thereof) in conjunction with gate electrode arrangement are utilized to facilitate formation of transistors that may otherwise have dimensions below critical dimensions for a given processing node. It is appreciated that the above-described features may facilitate formation of image sensors with small-pixel layouts but are also applicable to larger pixel layouts. Defined herein, a small-pixel layout corresponds to an image sensor having a separation distance between midpoints of two adjacent pixels being less than 1 μm (e.g., submicron pixel pitch), such as approximately 0.9 μm, 0.8 μm, 0.7 μm, 0.6 μm, 0.5 μm, 0.4 μm, 0.3 μm or otherwise. It is appreciated that the term "approximately" corresponds to within 10%, ±0.1 μm, or otherwise corresponds to variance associated with a given processing node utilized to fabricate the image sensor. It is further appreciated that while embodiments disclosed herein generally focus on image sensors with submicron pixel pitch, other embodiments may have a pixel pitch greater than 1 μm.

It is appreciated that embodiments of the disclosure reference "source" and "drain" regions of various transistors (e.g., row select, reset, source-follower, dual-floating diffusion, and other transistors associated with operation or readout of pixels or pixel cells) that correspond to doped regions within a semiconductor material or substrate. In such embodiments, a specific relationship may be described (e.g., drain regions of different transistors coupled together, source regions of different transistors coupled together, a source region of one transistor coupled to a drain region of another transistor, common junctions corresponding to source or drain regions of different transistors, and the like). While the terms "source" and "drain" generally refer to the direction charge carriers flow charge transfer (e.g., carriers moving from source region to drain region), it is appreciated that the transistors described herein may be symmetrical devices and thus can be operated with bidirectionality (e.g., carrier transfer from source to drain or carrier transfer from drain to source). Accordingly, one of ordinary skill in the art will understand that reference to an element as a "source" region or "drain" region does not necessarily limit the directionality of charge transfer of the associated transistor(s).

FIG. 1A illustrates an example stacked semiconductor device corresponding to imaging system 100, in accordance with embodiments of the disclosure. The imaging system

100 includes first semiconductor substrate 101, second semiconductor substrate 151, and third semiconductor substrate 191, each of which may correspond to a part of or an entirety of a semiconductor wafer in accordance with embodiments of the disclosure. The first semiconductor substrate 101 includes a plurality of pixel cells 105 and optionally periphery circuitry 106. In some embodiments, each pixel cell included in the plurality of pixel cells 105 includes one or more pixels (see, e.g., FIG. 1B) that share a common color filter type (see, e.g., FIG. 1C). Each pixel includes at least one photodiode to generate image charge in response to incident light. The second semiconductor substrate includes pixel cell circuitry 155 (e.g., for readout of the image charge from the plurality of pixel cells 105) and optionally periphery circuitry 156 (e.g., biasing circuitries or array of capacitors). The third semiconductor substrate 191 includes application specific integrated circuitry (ASIC) 196 for processing, inter alia, image signals readout by the pixel cell circuitry 155 from the plurality of pixel cells 105. In some embodiments, the pixel cell circuitry 155 may be segmented into groups of components (e.g., repeat units as illustrated in FIG. 2A) that are associated with respective pixel cells included in the plurality of pixel cells 105 to facilitate operation and/or readout for the imaging system 100. In some embodiments, each of the groups of components or repeat units formed by the pixel cell circuitry 155 may be correlated with a corresponding one of the pixel cells included in the plurality of pixel cells 105 such that there is at least a partial vertical overlap between the physical footprint of a given pixel cell included in the plurality of pixel cells 105 and a corresponding repeat unit included in the pixel cell circuitry 155 that provides readout for the given pixel cell.

In the illustrated embodiment of FIG. 1A, the imaging system 100 is a stacked complementary metal-oxide semiconductor (CMOS) image sensor formed, at least in part, by the first semiconductor substrate 101 (e.g., a first die), the second semiconductor substrate 151 (e.g., a second die), and optionally the third semiconductor substrate 191 (e.g., a third die) that are stacked and coupled together (e.g., electrically and/or physically) in a stacked chip scheme achieved via bonding (e.g., oxide bonding, metal bonding, hybrid bonding), silicon connections (e.g., through silicon vias), other suitable circuit coupling technologies, or combinations thereof. Additionally, it is appreciated that the view presented in FIG. 1A may omit certain elements of the imaging system 100 to avoid obscuring details of the disclosure. In other words, not all elements of the imaging system 100 may be labeled, illustrated, or otherwise shown within FIG. 1A or other figures throughout the disclosure. It is further appreciated that in some embodiments, the imaging system 100 may not necessarily include all elements shown. It is further appreciated that the term "semiconductor substrate" throughout the disclosure may correspond to a part of or an entirety of a semiconductor wafer (e.g., a silicon wafer). In some embodiments, the semiconductor substrate (e.g., the first semiconductor substrate 101, the second semiconductor substrate 151, and/or the third semiconductor substrate 191) includes or is otherwise formed of silicon, a silicon germanium alloy, germanium, a silicon carbide alloy, an indium gallium arsenide alloy, any other alloys formed of III-V group compounds, combinations thereof, or a bulk substrate thereof. In some embodiments, the first semiconductor substrate 101, the second semiconductor substrate 151, and/or the third semiconductor substrate 191 may be formed of the same or different materials.

The stacked chip scheme of the imaging system 100 illustrated in FIG. 1A distributes components across multiple substrates. Specifically, the first semiconductor substrate 101 includes photosensitive elements (e.g., a plurality of photodiodes such as pinned photodiodes or the like to form pixels) included in the plurality of pixel cells 105 while the second semiconductor substrate 151 includes pixel cell circuitry 155 associated with the plurality of pixel cells 105 (e.g., any one of or a combination of pixel transistors such as reset transistors, source-follower transistors, row select transistors, switchable conversion gain transistors, and so on, analog to digital circuitry, signal processing circuitry, or other circuitry to facilitate imaging an external scene with the pixels included in the plurality of pixel cells 105). Put in another way, the second semiconductor substrate 151 offloads at least part of the circuitry associated with the plurality of pixel cells 105 from the first semiconductor substrate 101, which advantageously provides additional space on the first semiconductor substrate 101 (e.g., to reduce pixel pitch, increase photodiode sensing area relative to total pixel area, and so on).

In some embodiments, the plurality of pixel cells 105 may be coupled to the pixel cell circuitry 155 through one or more hybrid bonds, through-silicon vias, other suitable circuitry coupling technologies, or combinations thereof. In some embodiments, the space saved on the first semiconductor substrate 101 by offloading circuitry to the second semiconductor substrate 151 (or other subsequent substrates in the stacked chip scheme) may be repurposed to increase the size of individual photodiodes included in each individual pixel included in the plurality of pixel cells 105 to allow for increased pixel size, density, sensitivity, full well capacity, combinations thereof, or the like. Additionally, or alternatively, functionality of the imaging system 100 may be facilitated as the second semiconductor substrate 151 may have room for additional components or circuitry that may not otherwise fit on an individual substrate that contains both the plurality of pixel cells 105 and the pixel cell circuitry 155 without affecting the performance and/or functionality of the imaging system 100. Additionally, it is appreciated that when reducing the pixel pitch of the plurality of pixel cells 105, there may be a commensurate increase in density for the pixel cell circuitry 155, which may place further constraints (e.g., in terms of meeting the design rule requirements dependent on the technology node being used for fabrication) on the design and layout of the pixel cell circuitry 155. Accordingly, the layout for the pixel cell circuitry 155 described in embodiments of the disclosure provides a suitable configuration for facilitating reduced pixel pitch (e.g., submicron pixel pitch) while simultaneously mitigating processing variations and reducing fabrication costs by utilizing a layout of the pixel cell circuitry 155 that includes, inter alia, repeat units having a shared gate electrode, a shared junction, a shared threshold voltage implant region, or combinations thereof.

In the illustrated embodiment, the second semiconductor substrate 151 is coupled to the first semiconductor substrate 101 and the third semiconductor substrate 191 (e.g., the second semiconductor substrate 151 is disposed between the first semiconductor substrate 101 and the third semiconductor substrate 191) to form the stacked semiconductor device. The first semiconductor substrate 101 includes the plurality of pixel cells 105, which are arranged in rows (e.g., R1, R2, R3, . . . . RY) and columns (e.g., C1, C2, C3, . . . . CX) to form the array of pixel cells. Each of the plurality of pixel cells 105 may include any number of pixels (e.g., one, two, four, eight, or more pixels per pixel cell). In most embodiments, the number of pixels per pixel cell included in the plurality of pixel cells 105 is uniform. In one embodiment, each pixel cell included in the plurality of pixel cells 105 have a regular arrangement (e.g., a two-by-two arrangement of four pixels, a two-by-three arrangement of six pixels, a two-by-four arrangement of eight pixels, a four-by-four arrangement of sixteen pixels, or otherwise). In some embodiments, an individual pixel cell included in the plurality of pixel cells 105 may correspond to a minimal repeating unit of the first semiconductor substrate 101, or more specifically, the plurality of pixel cells 105. In other embodiments, a group of pixel cells included in the plurality of pixel cells 105 may correspond to a minimal repeating unit of the first semiconductor substrate 101 and/or the plurality of pixel cells 105 (e.g., a two-by-two group of pixel cells included in the plurality of pixel cells 105 may correspond to a minimal repeating unit). In some embodiments, the pixel cell circuitry 155 of the second semiconductor substrate 151 is arranged based on a corresponding arrangement of the plurality of pixel cells 105 on the first semiconductor substrate 101. For example, in some embodiments, one or more pixel cells included in the plurality of pixel cells 105 of the first semiconductor substrate 101 may be respectively coupled to respective repeat units included in the pixel cell circuitry 155 of the second semiconductor substrate 151 on a per-pixel or per-pixel cell basis, which may result in an arrangement of the pixel cell circuitry 155 being regular and/or repeating (e.g., in rows and columns as illustrated).

As illustrated in FIG. 1A, the first semiconductor substrate 101 and the second semiconductor substrate 151 include various analog and/or digital support circuitry for the imaging system 100, respectively corresponding to the periphery circuitry 106 and the periphery circuitry 156. In some embodiments, support circuitry that may be included in the periphery circuitry 106 and/or the periphery circuitry 156 may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the imaging system 100. In some embodiments, components that may be included in the periphery circuitry 106, periphery circuitry 156, or other components may additionally or alternatively be included in the third semiconductor substrate 191 as part of the functionality of the ASIC 196 or otherwise.

Figure 1B:
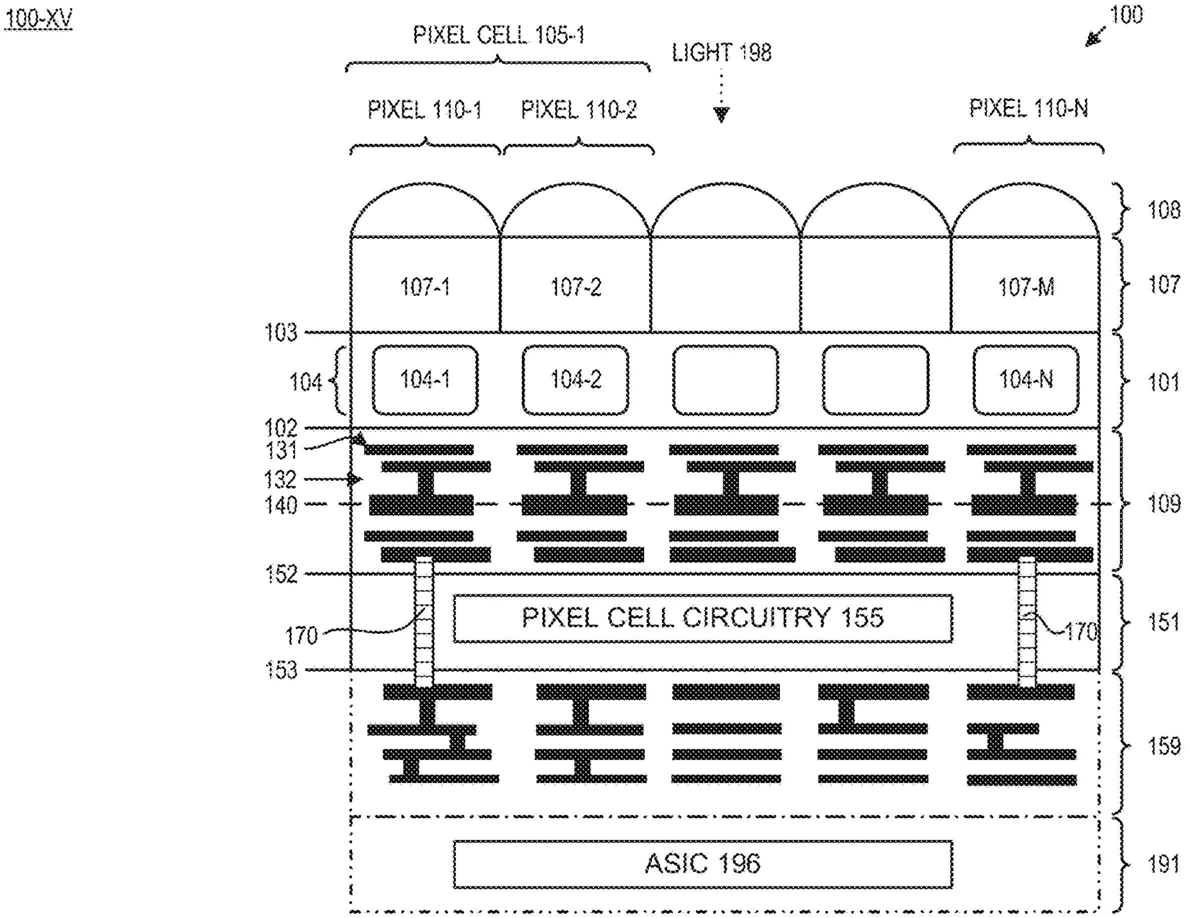
FIG. 1B illustrates a cross-sectional view of the example imaging system of FIG. 1A, in accordance with an embodiment of the disclosure.
Figure 2A:
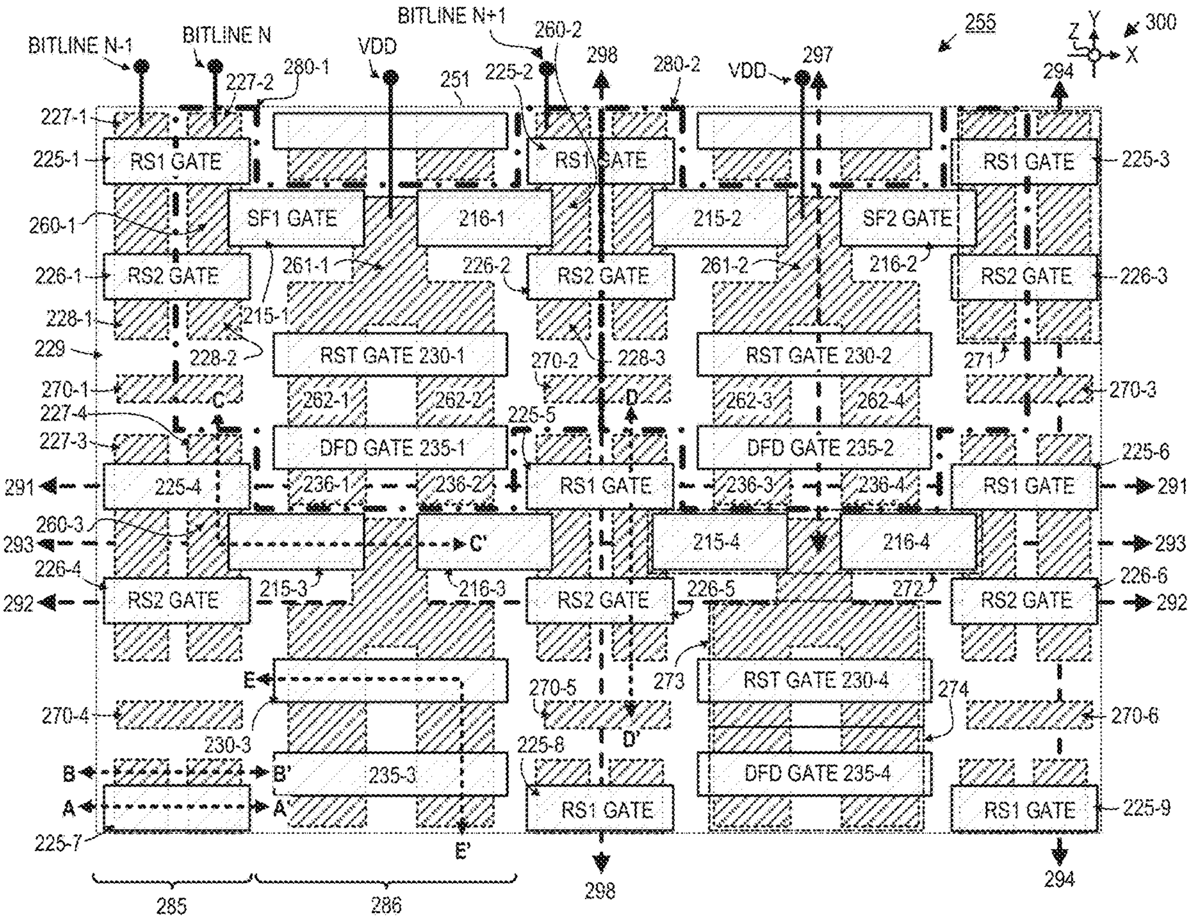
FIG. 2A illustrates a top view of a second semiconductor substrate having a plurality of repeat units that form pixel cell circuitry for readout of pixel cells, in accordance with an embodiment of the disclosure.

FIG. 1B illustrates a cross-sectional view 100-XV of the example imaging system 100 of FIG. 1A, in accordance with an embodiment of the disclosure. As illustrated, the second semiconductor substrate 151 is disposed between the first semiconductor substrate 101 and the third semiconductor substrate 191. The first semiconductor substrate 101 is coupled to the second semiconductor substrate 151 at interface 140 within metallization region 109 via a plurality of hybrid bonds. The metallization region 109 includes one or more metal layers 131 disposed between one or more inter-metal dielectric layers 132 or inter-layer dielectrics (not labeled, see, e.g., FIG. 2B-2F). In some embodiments, other stacking connection schemes may be utilized in addition to, or in place of hybrid bonding, such as through-silicon vias, a combination of hybrid bonding and through-silicon vias, or other suitable circuitry coupling technologies. It is appreciated that in the illustrated embodiment, the metallization region 159 may couple the second semiconductor substrate 151 or the first semiconductor 101 to the third semiconductor substrate 191 through corresponding through-silicon vias 170.

As illustrated, the imaging system 100 further includes a plurality of photodiodes 104 (e.g., a first photodiode 104-1, a second photodiode 104-2, and so on until a Nth photodiode 104-N, where "N" corresponds to the total number of photodiodes included in the plurality of photodiodes 104) disposed between a first side 102 (e.g., a front side, a backside, or a non-illuminated side) and a second side 103 (e.g., a backside, a front side, or an illuminated side) opposite the first side 102 of the first semiconductor substrate 101, a plurality of color filters 107 (e.g., a first color filter 107-1, a second color filter 107-2, and so on until an Mth color filter 107-M, where "M" corresponds to the total number of color filters included in the plurality of color filters 107), and a plurality of microlenses 108 to collectively form a plurality of pixels 110 (e.g., a first pixel 110-1, a second pixel 110-2, and so until an Nth pixel 110-N, where "N" corresponds to the total number of pixels included in the plurality of pixels 110). As discussed previously the plurality of pixels 110 are segmented to form pixel cells included in the plurality of pixel cells 105 (e.g., a first pixel cell 105-1 as illustrated, which may be representative of any other pixel cell included in the plurality of pixel cells 105). It is appreciated that in some embodiments, the total number of color filters (e.g., "M") included in the plurality of color filters 107 may be equal to the total number of photodiodes (e.g., "N") included in the plurality of photodiodes 104 (e.g., a one-to-one ratio of color filters to photodiodes). However, in other embodiments the plurality of color filters 107 may be shared by adjacent photodiodes included in the plurality of photodiodes 104 such that "M" is less than "N." For example, in some embodiments each pixel cell included in the plurality of pixel cells 105 may include multiple pixels included in the plurality of pixels 110. In some embodiments, pixels included in the plurality of pixels 110 for a common pixel cell included in the plurality of pixel cells 105 (e.g., the first pixel 110-1 and the second pixel 110-2 are included in the first pixel cell 105-1) may share the same color filter or otherwise have a common color filter configuration (e.g., the first color filter 107-1 and the second color filter 107-2 may have a common spectral photoresponse).

As illustrated, the plurality of color filters 107 are optically disposed between the plurality of microlenses 108 and the plurality of photodiodes 104 such that light 198 propagates through both the plurality of microlenses 108 and the plurality of color filters 107 before reaching the plurality of photodiodes 104 (i.e., when the imaging system 100 is a backside illuminated image sensor). Each microlens included in the plurality of microlenses 108 is configured to direct or otherwise focus the light 198 through an underlying color filter included in the plurality of color filters 107 and the second side 103 of the first semiconductor substrate 101 towards a respective one of the plurality of photodiodes 104 in the first semiconductor substrate 101. The plurality of color filters 107 filter or otherwise attenuate the light 198 focused by the plurality of microlenses 108. In some embodiments, the plurality of color filters 107 may include one or more red, green, blue, infrared, clear, transparent, cyan, magenta, yellow, black, or any other color filter to filter visible or non-visible light (e.g., light 198). Similar to the plurality of color filters 107, the total number of microlenses included in the plurality of microlenses 108 may be equal to the total number of photodiodes (e.g., "N") included in the plurality of photodiodes 104 (e.g., a one-to-one ratio of microlenses to photodiodes) and/or the total number of color filters (e.g., "M") included in the plurality of color filters 107 (e.g., a one-to-one ratio of microlenses to color filters). However, in other embodiments the plurality of microlenses 108 may be shared by adjacent photodiodes included in the plurality of photodiodes 104 (e.g., a group of adjacent photodiodes included in the plurality of photodiodes 104, such as the first photodiode 104-1, the second photodiode 104-2, and/or other photodiodes adjacent to the first photodiode 104-1 and the second photodiode 104-2, may be optically aligned with or otherwise share an individual microlens included in the plurality of microlenses 108).

As illustrated in FIG. 1B, pixel cell circuitry 155 is disposed in or on the second semiconductor substrate 151 and ASIC 196 is disposed in or on the third semiconductor substrate 191. In some embodiments, the pixel cell circuitry 155 includes pixel transistors such as reset transistors, source-follower transistors, row select transistors, switchable conversion gain or dual floating diffusion transistors, and so on, analog to digital circuitry, signal processing circuitry, other circuitry to facilitate imaging an external scene, or combinations thereof. In the same or other embodiments, certain circuitry elements may be offloaded to the third semiconductor substrate 191 (e.g., analog to digital circuitry, signal processing circuitry, phase detection, and other circuitry to facilitate imaging). It is appreciated that in some embodiments, certain circuitry elements may also be present in or on the first semiconductor substrate 101 that are not illustrated in FIG. 1A (e.g., one or more transfer gates, floating diffusion regions, and the like as illustrated in FIGS. 1E-1F).

Figure 1C:
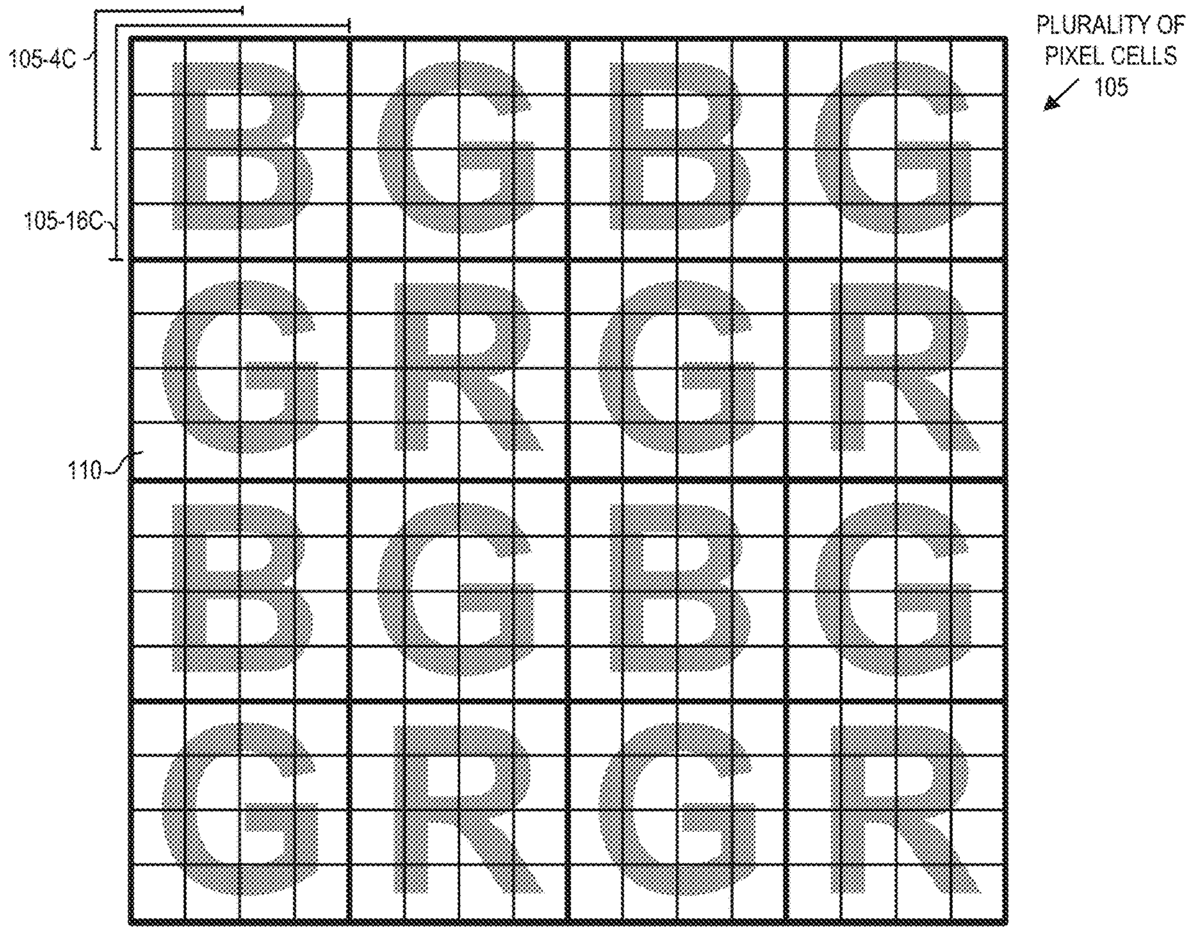
FIG. 1C illustrates an example top view of a plurality of pixel cells included in the example imaging system of FIG. 1A, in accordance with an embodiment of the disclosure.

FIG. 1C illustrates an example top view of the plurality of pixel cells 105 included in the first semiconductor substrate 101 of the example imaging system of FIG. 1A, in accordance with an embodiment of the disclosure. As illustrated, each pixel cell included in the plurality of pixel cells 105 includes one or more pixels included in the plurality of pixels 110. The plurality of pixels 110 may be segmented by overlying color filter type such as red, "R", green, "G", blue, "B" or other color filter types (infrared, clear, transparent, cyan, magenta, yellow, black, or any other color filter to filter visible or non-visible light) to form the plurality of pixel cells 105. In the illustrated example, each pixel cell included in the plurality of pixel cells has a maximum cell size that includes a four-by-four array of pixels included in the plurality of pixels 110, which includes 16 total pixels. However, in other embodiments different maximum cell size pixel cells may be utilized that are smaller or greater than 16 total pixels. Accordingly, a pixel cell included in the plurality of pixels cells 105 having 16 pixels may be referred to as a 16C pixel cell (see, e.g., 105-16C). However, it is appreciated that each 16C pixel cell included in the plurality of pixel cells 105 is comprised of four 4C pixel cells (e.g., pixel cells with a two-by-two arrangement of pixels included in the plurality of pixels). For example, the labeled 16C pixel cell 105-16C comprises four instances of the 4C pixel cell 105-4C arranged in a two-by-two pattern. As will be discussed later in the disclosure, repeat units of pixel cell circuitry (e.g., plurality of repeat units 280 of pixel cell circuitry 255 illustrated in FIG. 2A) are arranged to vertically overlap, respectively, with 4C pixel cells (e.g., 105-4C having a two-by-two pixel configuration) that are included in the plurality of pixel cells 105.

In the illustrated embodiment of FIG. 1C, a non-limiting embodiment of the plurality of pixel cells 105 having an arrangement forming a Bayer pattern (e.g., repeat units of 16C pixel cells included in the plurality of pixel cells 105 arranged to have one blue ("B") 16C pixel cell, two green ("G") 16C pixel cell, and one red (R") 16C pixel cell) is provided. However, in other embodiments different color filter arrangements (e.g., RGRW, RGB-IR, or otherwise) that do not necessarily correspond to a Bayer pattern may be utilized.

Figure 1D:
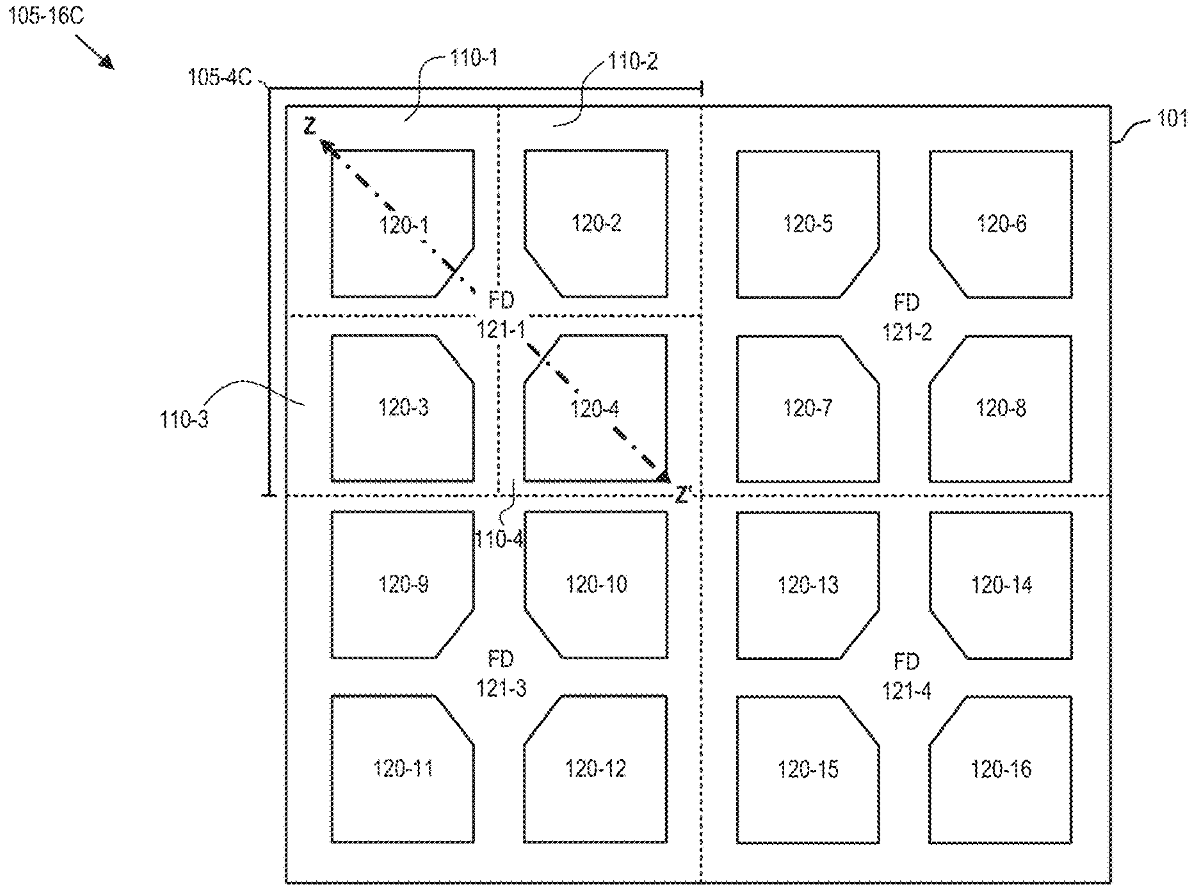
FIG. 1D illustrates a top view of an example 16C pixel cell included in the plurality of pixel cells included in the imaging system of FIG. 1A, in accordance with an embodiment of the disclosure.
Figure 1E:
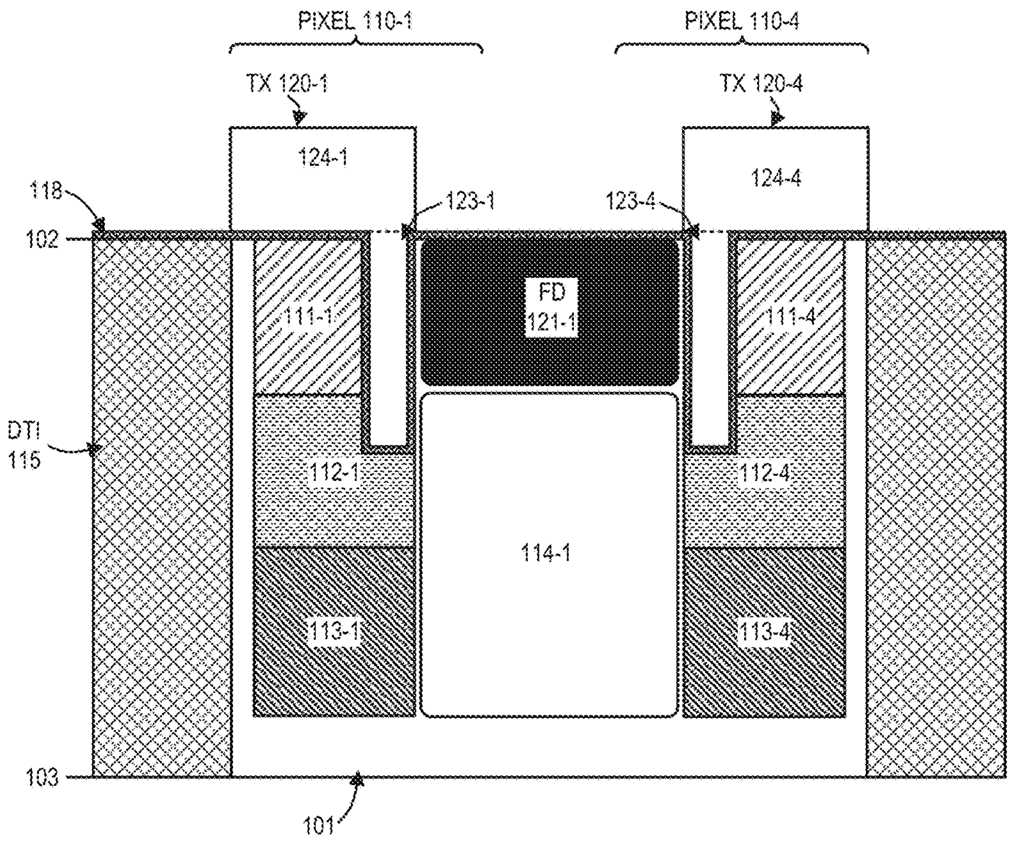
FIG. 1E illustrates a cross-sectional view of a first semiconductor substrate along line Z-Z' shown in FIG. 1D, in accordance with an embodiment of the disclosure.
Figure 1F:
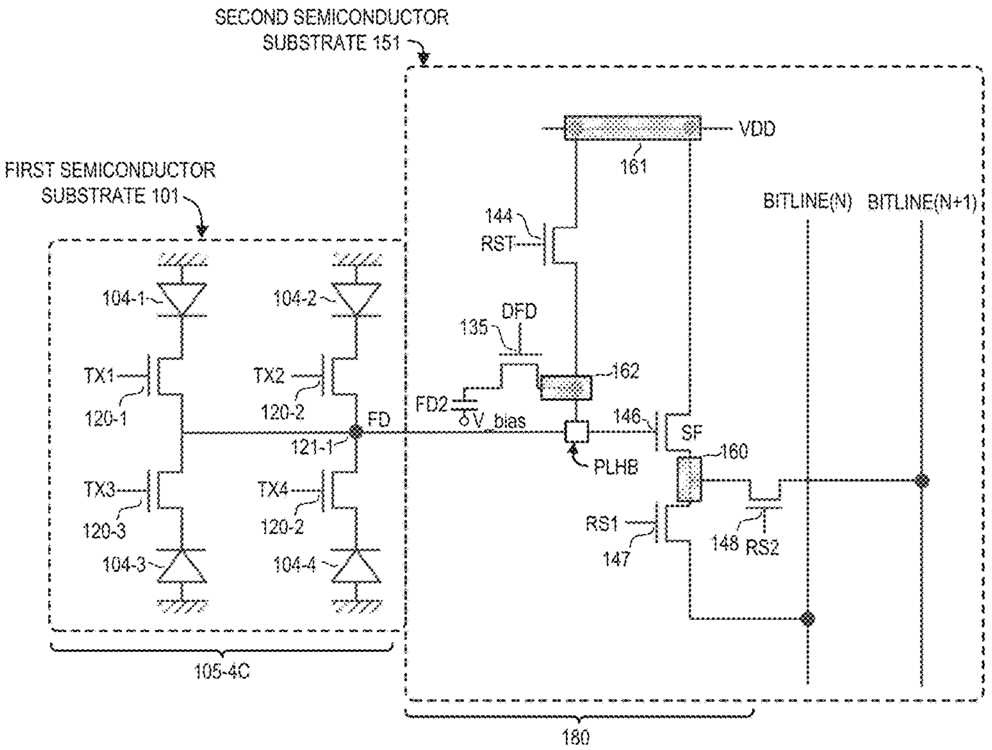
FIG. 1F illustrates an example schematic for readout of a 4C pixel cell included in the plurality of pixel cells of the imaging system of FIG. 1A, in accordance with an embodiment of the disclosure.

FIG. 1D illustrates a top view of an example 16C pixel cell 105-16C included in the plurality of pixel cells 105 included in the imaging system 100 of FIG. 1A, in accordance with an embodiment of the disclosure. As discussed previously, the 16C pixel cell 105-16C includes a two-by-two array of 4C pixel cells 105-4C. Each 4C pixel cell 105-4C includes a two-by-two array of pixels included in the plurality of pixels 110. For example, the labeled 4C pixel cell 105-4C includes pixels 110-1, 110-2, 110-3, and 110-4 arranged in a two-by-two array of pixels. Each of the pixels included in the plurality of pixels 110 include an underlying photodiode (see, e.g., FIG. 1E) disposed or otherwise formed within the semiconductor substrate 101. Each of the plurality of pixels 110 further includes a corresponding transfer gate included in a plurality of transfer gates 120 (e.g., 120-1, 120-2, 120-3, 120-4, 120-5, 120-6, 120-7, 120-8, 120-9, 120-10, 120-11, 120-12, 120-13, 120-14, 120-15, and 120-16). For example, the 4C pixel cell formed by pixels 110-1 through 110-4 includes transfer gates 120-1 through 120-4 similarly arranged to form a two-by-two array of transfer gates.

In the illustrated embodiment, each two-by-two array of transfer gates are shaped (when viewed from a top view) to correspond to a rectangle or square with a corner or vertex cut off (e.g., a convex pentagon with three adjacent right angles). The cut off corners of the transfer gates may be arranged adjacently for a given 4C pixel cell to form an edge parallel with an edge of a diagonally disposed transfer gate to laterally (when viewed from a top view) surround a floating diffusion region ("FD") formed in the semiconductor substrate 101. For example, transfer gates 120-1 through 120-4 included in the plurality of transfer gates 120 laterally surround floating diffusion region 121-1. It is appreciated that the plurality of transfer gates 120 for a given 4C pixel cell included in the plurality of pixel cells 105 are coupled to the same or a common floating diffusion region (e.g., 121-1, 121-2, 121-3, and 121-4) included in the plurality of floating diffusion regions 121 formed in the semiconductor substrate 101. It is appreciated that the shape and/or dimension of the plurality of transfer gates 120 may be configured based on a specific layout of a given 4C pixel cell. For example, other polygonal shape such as triangular or trapezoidal may also be employed.

More generally, it is appreciated that in the illustrated embodiment, each 4C pixel cell included in the plurality of pixel cells 105 is associated with an individual floating diffusion region included in the plurality of floating diffusion regions 121 (see, e.g., FIG. 1F). In various embodiments, the plurality of floating diffusion regions 121 and the corresponding photodiode of the plurality of pixel 110 are formed or otherwise disposed on the same semiconductor substrate (e.g., semiconductor substrate 101) and the plurality of floating diffusion regions 121 are coupled to the corresponding circuitry of pixel cell circuitry 155 through one or more hybrid bond connections. In some embodiments, floating diffusion regions of adjacent 4C pixel cells may be coupled together. For example, floating diffusion regions 121-1 and 121-3 may be directly coupled together through one or more metal wires and/or contact vias formed in the metallization region 109. Similarly, floating diffusion regions 121-2 and 121-4 may be directly coupled. It is appreciated that coupling floating diffusion regions together may reduce the number of hybrid bond connections necessary for a given 16C pixel cell. For example, in the illustrated embodiment, hybrid bond connections between the first semiconductor substrate 101 and the second semiconductor substrate 151 may be reduced to two connections per 16C pixel cell. However, it is appreciated that in other embodiments there may be a different number of hybrid bond connections for each 16C pixel cell. For example, in some embodiments there may be a hybrid bond connection for each 4C pixel cell, each 2C pixel cell, or each pixel cell depending on the desired configuration. Additionally, in some embodiments, there may be different floating diffusion region configurations (e.g., a floating diffusion region for each pixel, each pair of pixels, or otherwise). It is appreciated that in changing the configuration of the plurality of floating diffusion regions 121, the configuration of the pixel cell circuitry 155 of the second semiconductor substrate 151 may be adjusted as necessary to accommodate the changed number of hybrid bond connections.

FIG. 1E illustrates a cross-sectional view 101-ZZ' of the first semiconductor substrate 101 along line Z-Z' shown in FIG. 1D, in accordance with an embodiment of the disclosure. The illustrated embodiment is one possible way of forming a plurality of pixels 110 included in the first semiconductor substrate 101 in which a given transfer gate (e.g., transfer gates 120-1 and 120-4) may include one or more vertical gate portions (e.g., vertical transfer gate 123-1, 123-4). However, it is appreciated that other configurations may alternatively be implemented (e.g., transfer transistors without vertical gate portions).

The cross-sectional view 101-ZZ' includes pixels 110-1 and 110-2, which each include a respective transfer gate (e.g., 120-1 and 120-4), pinning region (e.g., 111-1 and 111-4), doped region (112-1 and 112-4), and deep doped region (e.g., 113-1 and 113-4). The pinning region, doped region, and deep doped region collectively form a pinned photodiode included in a given pixel (e.g., pixels 110-1 and 110-4). Disposed between the pinned photodiode of the given pixel and the corresponding transfer gate is gate insulation layer 118 that functions as a gate dielectric. It is appreciated that in the illustrated embodiment, the floating diffusion region is shared for a given 4C pixel cell (e.g., as illustrated in FIG. 1D). As illustrated, deep trench isolation (DTI) structure 115 may extend from the first side 102 towards the second side 103 of the first semiconductor substrate 101 or from the second side 103 towards first side 102 so as to isolate pixels 110-1 and 110-4 from other pixels included in other 4C pixel cells while well 114-1 provides, in part, isolation between adjacent pinned photodiodes included in an individual 4C pixel cell. It is appreciated that the pixels 110-1 and 110-4 may be representative of any other pixel included in the plurality of pixels 110.

In some embodiments, the DTI structure 115 includes an oxide material (e.g., silicon dioxide) or other insulating material. In some embodiments, a depthwise thickness of the DTI structure 115 may be substantially the same as a thickness of the semiconductor substrate 101. In the same or other embodiments, the pinning regions 111-1 and 111-4, the doped regions 112-1 and 112-4, the deep doped regions 113-1 and 113-4, well 114-1, and floating diffusion region 121-1 correspond to doped regions of the semiconductor substrate 101 in which dopants have been implanted or otherwise diffused into the semiconductor substrate within specified locations. For example, pinning regions 111-1 and 111-4 and well 114-1 may have a first conductivity type (e.g., P-type or N-type) that is opposite of a second conductivity type (e.g., N-type or P-type) of the doped region 112-1 and 112-4, deep doped regions 113-1 and 113-4, and floating diffusion region 121-1. However, it is appreciated that in some embodiments certain elements may be omitted (e.g., pinning regions 111-1 and 111-4 and deep doped regions 113-1 and 113-4 may be optionally omitted when the photodiode is not a pinned photodiode).

As illustrated in FIG. 1E, transfer gates 120-1 and 120-4 and floating diffusion region 121-1 are each disposed proximate to the first side 102 of the first semiconductor substrate 101. Each of the plurality of transfer gates 120 include a respective planar region electrically coupled to a vertical region (e.g., transfer gate 120-1 includes planar region 124-1 coupled to vertical region 123-1 and transfer gate 120-4 includes planar region 124-4 coupled to vertical region 123-4). For example, the vertical region 124-1 extends from the planar region 123-1 of the transfer gate 120-1 into the first semiconductor substrate 101 towards the second side 103 of the first semiconductor substrate 101. Disposed between the plurality of transfer gates 120 and the plurality of photodiodes (e.g., the plurality of pinning regions 111, the plurality of doped regions 112, and the plurality of deep doped regions 113) is the gate insulation layer 118, which provides an insulating barrier (e.g., to form a plurality of transfer transistors). In some embodiments the gate insulation layer 118 is silicon dioxide, hafnium oxide, aluminum oxide, or any other insulating material with suitable properties for forming the plurality of transfer transistors.

FIG. 1F illustrates an example schematic 185 for readout of a 4C pixel cell 105-4C included in the plurality of pixel cells 105 of the imaging system 100 of FIG. 1A, in accordance with an embodiment of the disclosure. More specifically, the example schematic 185 illustrates a representation of 4C pixel cell 105-4C formed in or on first semiconductor substrate 101 coupled to a repeat unit 180 of pixel cell circuitry (e.g., pixel cell circuitry 155) formed in or on the second semiconductor substrate 151. As illustrated, 4C pixel cell 105-4C includes photodiodes 104-1, 104-2, 104-3, and 104-4, transfer gates 120-1, 120-2, 120-3, and 120-4, and floating diffusion region 121-1. Transfer gate 120-1 is coupled to transfer image charge from photodiode 104-1 to floating diffusion region 121-1 in response to transfer gate signal TX1. Transfer gate 120-2 is coupled to transfer image charge from photodiode 104-2 to floating diffusion region 121-1 in response to transfer gate signal TX2. Transfer gate 120-3 is coupled to transfer image charge from photodiode 104-3 to floating diffusion region 121-1 in response to transfer gate signal TX3. Transfer gate 120-4 is coupled to transfer image charge from photodiode 104-4 to floating diffusion region 121-1 in response to transfer gate signal TX4. As illustrated, floating diffusion region 121-1 is a shared floating diffusion region that is coupled to each of the photodiodes included in the 4C pixel cell 105-4C. In the illustrated embodiment, the floating diffusion region 121-1 is coupled to components included in the repeat unit 180 formed in or on second semiconductor substrate 151 by a pixel level hybrid bond (PLHB). It is appreciated that repeat unit 180 is exemplary and in some embodiments not all elements of the repeat unit 180 may be illustrated to avoid obscuring certain aspects of the disclosure. Additionally, in the same or other embodiments one or more components of the repeat unit 180 may be omitted (e.g., dual floating diffusion transistor 135 and FD2).

As illustrated, reset transistor 144 is coupled to the floating diffusion region 121-1 via the PLHB to reset the 4C pixel cell 105-4C (e.g., discharge or charge the photodiodes 104-1, 104-2, 104-3, and 104-4) and the floating diffusion region 121-1 to a preset voltage in response to a reset signal RST. The gate of the source-follower transistor 146 is also coupled to the floating diffusion region 121-1 such that the source-follower transistor 146 outputs an image signal (e.g., image data) in response to image charge in the floating diffusion region 121-1. A first row select transistor 147 and a second row select transistor 148 are coupled together and further coupled to the source-follower transistor 146 to output the image data signal to a selected bitline (e.g., bitline N or bitline N+1) in response to row select signals RS1 and/or RS2. It is appreciated that in some embodiments having dual row select transistors (e.g., first row select transistor 147 and second row select transistor 148) provides selective binning of image data during readout. In some embodiments, a dual floating diffusion transistor 135 may optionally be coupled between the floating diffusion region 121-1 and the reset transistor 144 to provide additional dynamic range capabilities to the 4C pixel cell 105-4C, if desired, in response to a dual floating diffusion signal DFD. In some embodiments, the additional dynamic range is provided by a capacitor such as a lateral overflow integration capacitor or a junction capacitor (e.g., corresponding to FD2). In the illustrated embodiments, the capacitor, denoted by FD2, may have one end coupled to a source of dual floating diffusion transistor 135 and the other end coupled to receive a biasing voltage (e.g., V_bias) for conversion gain configuration and signal readout operation control.

In some embodiments, components included in the repeat unit 180 illustrated in FIG. 1F may further be coupled to components included in other instances of the repeat unit 180 (e.g., that facilitate operation or readout of adjacent instances of the 4C pixel cell 105-4C. For example, a 16C pixel cell may include a two-by-two array of four 4C pixel cells that each correspond to 4C pixel cell 105-4C. In some embodiments, the 4C pixel cells may be coupled to respective instances of the repeat unit 180 to facilitate readout. This arrangement may be continued for each 16C pixel cell included in the imaging system. In other embodiments, each 16C pixel cell may include a first row (or first column) of 4C pixel cells that are coupled to respective instances of the repeat unit 180 while a second row (or second column) of the 4C pixel cells are coupled to an adjacent one of the 4C pixel cells included in the first row (or first column) of the 16C pixel cell. For example, referring to FIG. 1D, floating diffusion regions 121-1 and 121-3 may be coupled together in or on the first semiconductor substrate 101 and then subsequently coupled (e.g., via a PLHB) to an instance of the repeat unit 180 illustrated in FIG. 1F. In such an embodiment, the different rows (e.g., the first row associated with floating diffusion region 121-1 and the second row associated with floating diffusion region 121-3) can be readout to different bitlines via the row select signals RS1 and RS2.

Referring back to FIG. 1F, it is appreciated that, in some embodiments, components may be arranged to use one or more common junctions (e.g., common junctions 160, 161, and 162) formed in the second semiconductor substrate 151 to meet the design rule requirements set by a foundry when fabricating submicron pixel pitch image sensors. The one or more common junctions (e.g., common junctions 160, 161, and 162) formed in the second semiconductor substrate 151 may be formed in regions of second semiconductor substrate 151 defined by isolation structures (e.g., shallow trench isolation structures) disposed in or on the second semiconductor substrate 151. The common junctions 160, 161, and 162, may further facilitate reduced costs by utilizing the doped regions of the second semiconductor substrate 151 in combination with isolation structures to couple circuitry components. In one embodiment, common junction 160 couples the drains of the first row select transistor 147 and the second row select transistor 148 together, which is further coupled to the source of the source-follower transistor 160. In the same or other embodiments, common junction 161 couples the drain of reset transistor 144 and the drain of the source-follower transistor 146 together and further coupled to receive a supply voltage VDD. In the same or other embodiments, common junction 162 couples the floating diffusion region 121-1 to the drain of the dual floating diffusion transistor 135 and the source of the reset transistor 144, which are also coupled together. Furthermore, it is appreciated that the common junctions may further facilitate connections between components associated with other instances of the repeat unit 180. For example, the drains of source-follower transistors for two adjacent instances of the repeat unit 180 may be coupled together (see, e.g., FIG. 2A) to a supply voltage e.g., supply voltage VDD.

Additionally, the gates of the dual floating diffusion transistor 135 for adjacent instances of the repeat unit 180 may correspond to a shared gate electrode (see, e.g., FIG. 2A). In the same or other embodiments, the gates of the reset transistor 144 for adjacent instances of the repeat unit 180 may correspond to a shared gate electrode (see, e.g., FIG. 2A). It is appreciated that the shared gate electrodes for the reset transistors 144 and the dual floating diffusion transistors 135 may be associated with adjacent instances of the 4C pixel cell 105-4C that are within a given 16C pixel cell. In the same or other embodiments adjacently positioned instances of the repeat unit 180 that are associated with adjacent 16C pixel cells may be coupled together by a shared gate electrode for the first row select transistor 147 and/or by shared gate electrode for the second row select transistor 148 (see, e.g., FIG. 2A). It is appreciated that the shared gate electrodes may provide supplement or replace certain aspects of internal routing that would normally occur within the metallization region for both intra-coupling within a given 16C pixel cell to couple 4C pixel cells included in the given 16C pixel cell and inter-coupling of adjacent 16C pixel cells. In such a manner, the shared gate electrodes provide reduced fabrication costs by reducing the total number of metal layers and contact vias needed within the metallization region, enabling signal routing flexibility on the metal layers, and simplifying routing for the pixel cell circuitry while still maintaining compatibility with submicron pixel pitch image sensors.

FIG. 2A illustrates a top view of a second semiconductor substrate 251 having a plurality of repeat units 280 that form pixel cell circuitry 255 for readout of pixel cells, in accordance with an embodiment of the disclosure. In the illustrated embodiment, the second semiconductor substrate 251 corresponds to a transistor substrate that includes the pixel cell circuitry 255 such that the plurality of repeat units 280 do not include any photodiodes (e.g., which may be disposed or otherwise distributed on a sensor substrate such as the first semiconductor substrate illustrated in FIG. 1A). The pixel cell circuitry 255 is one possible implementation of the pixel cell circuitry 155 illustrated in FIG. 1A for the imaging system 100. In some embodiments, an individual one of the plurality of repeat units 280 (e.g., first repeat unit 280-1 or second repeat unit 280-2) is representative of a group of the repeat unit 180 illustrated in FIG. 1F. More specifically, each instance of the plurality of repeat units 280 facilitates operation/readout of a 16C pixel cell. In other words, a given repeat unit included in the plurality of repeat units 280 is representative, in some embodiments, of two instances of the repeat unit 180 illustrated in FIG. 1F. As discussed previously, adjacent floating diffusion regions 121 illustrated in FIG. 1F may be coupled together such that each 16C pixel cell may be readout with two repeat units 180 of the pixel cell circuitry 155. The example view illustrated in FIG. 2A is one possible implementation that provides a layout compatible with submicron pixel pitch that utilizes shared gate electrodes formed on the second semiconductor substrate 251 and/or common junctions formed in second semiconductor substrate 251 for internal routing that couples components of the pixel cell circuitry 255 together and shared threshold voltage doped regions for threshold voltage control of transistors, which provide, inter alia, compatibility with submicron pixel pitch of pixels, compliance with design rule requirements of a given technology processing node, and reduce manufacturing costs.

The embodiment illustrated in FIG. 2A shows the plurality of repeat units 280 (e.g., the first repeat unit 280-1 and the second repeat unit 280-2), which may respectively provide readout of adjacent 16C pixel cells included in a plurality of pixel cells (e.g., two adjacent 16C pixel cells included in the plurality of pixel cells 105 illustrated in FIG. 1C). Many of the components included in the plurality of repeat units 280 of FIG. 2A are labeled. However, it is appreciated that each component is not necessarily labeled or otherwise illustrated to avoid obscuring certain details of the disclosure. Furthermore, it is appreciated that the view presented by FIG. 2A is a limited view that may expand in a repeating manner (e.g., additional instances of the repeat units included in the plurality of repeat units 280 arranged in rows and columns) to accommodate the number of 16C pixel cells that are operated/readout by the plurality of repeat units 280. In other words, in some embodiments there may be a corresponding instance of a repeat unit included in the plurality of repeat units 280 for each 16C pixel cell that is being operated/readout by the pixel cell circuitry 255.

In the illustrated embodiment, the pixel cell circuitry 255 includes a plurality of source follower gate electrodes 215 (e.g., SF1 gate electrodes 215-1, 215-2, 215-3, and 215-4) and 216 (e.g., SF2 gate electrodes 216-1, 216-2, 216-3, and 216-4), a plurality of row select gate electrodes 225 (e.g., RS1 gate electrodes 225-1, 225-2, 225-3, 225-4, 225-5, 225-7, 225-7, 225-8, and 225-9) and 226 (e.g., RS2 gate electrodes 226-1, 226-2, 226-3, 226-4, 226-5, and 226-6), source regions 227 of row select transistors (e.g., RS1 source regions 227-1, 227-2, 227-3, and 227-4) and 228 (e.g., RS2 source regions 228-1, 228-2, 228-3), isolation structure 229 (e.g., corresponding to the white regions of the second semiconductor substrate 251 that may define perimeter boundaries of the regions with a diagonally striped pattern for pixel cell circuitries in the illustrated embodiment), a plurality of reset gate electrodes 230 (e.g., RST gate electrodes 230-1, 230-2, 230-3, and 230-4), a plurality of dual floating diffusion (DFD) gate electrodes 235 (e.g., DFD gate electrodes 235-1, 235-2, 235-3, and 235-4), source regions 236 of the DFD transistors (e.g., 236-1, 236-2, 236-3, 236-4), common junctions 260 (e.g., 260-1, 260-2, 260-3), common junctions 261 (e.g., 261-1 and 261-2), common junctions 262 (e.g., 262-1, 261-2, 261-3, and 264-4), a plurality of ground contact regions 270 (e.g., 270-1, 270-2, 270-3, 270-4, 270-5, and 270-6), first threshold voltage doped region 271, second threshold voltage doped region 272, third threshold voltage doped region 273, and fourth threshold voltage doped region 274.

It is appreciated that FIG. 2A illustrates one exemplary embodiment of the disclosure where each of the plurality of repeat units 280 includes four row select transistors associated with a shared gate electrodes (e.g., two RS1 transistors and two RS2 transistors, each sharing a gate electrode with a corresponding row select transistor of an adjacent repeat unit), two source-follower transistors, two reset transistors associated with a shared gate electrode, and two dual-floating diffusion transistors associated with a shared gate electrode. However, it is appreciated that other embodiments may utilize a different configuration (e.g., RS1 or RS2 transistors may be omitted, dual floating diffusion transistors may be omitted, additional transistors may be included, or combinations thereof). For example, in one embodiment, an additional pair of transistors may be included with a shared gate structure (e.g., coupled to, or replacing, the dual floating diffusion transistors) for adjusting conversion gain of pixel circuits, etc.

As illustrated in FIG. 2A, components included in the pixel cell circuitry 255 form a plurality of source-follower transistors (SF1 and SF2), row select transistors (RS1 and RS2), reset transistors (RST), and dual floating diffusion regions (DFD) that may include shared gate electrodes and/or common junction regions. In some embodiments, each repeat unit included in the plurality of repeat units 280 includes two source-follower transistors (e.g., SF1 and SF2), two reset transistors, four row select transistors, and optionally two dual floating diffusion transistors, to respectively operate/readout a vertically overlapping 16C pixel cell on the first semiconductor substrate (e.g., the first semiconductor substrate 101). In the illustrated embodiment, first repeat unit 280-1 includes a first group of coupled and adjacently disposed row select transistors with a row select transistor (e.g., including RS1 gate electrode 225-1, source region 227-2, and a drain region represented by common junction 260-1) and another row select transistor (e.g., including RS2 gate electrode 226-1, source region 228-2, and a drain region also represented by the common junction 260-1), a second group of coupled and adjacently disposed row select transistors including a row select transistor (e.g., including RS1 gate electrode 225-2, an unlabeled source region coupled to bitline N+1, and a drain region represented by common junction 260-2) and another row select transistor (e.g., including RS2 gate electrode 226-2, source region 228-3, and a drain region also represented by common junction 260-2), a first source-follower transistor (e.g., SF1 gate electrode 215-1, a source region corresponding to the common junction 260-1, and a drain region corresponding to the common junction 261-1), a second source-follower transistor (e.g., SF2 gate electrode 216-1, a source region corresponding to common junction 260-2, and a drain region corresponding to the common junction 261-1), a first reset transistor (e.g., RST gate electrode 230-1, a source region corresponding to common junction 262-1, and a drain region corresponding to common junction 261-1), a second reset transistor (e.g., RST gate electrode 230-1, a source region corresponding to common junction 262-2, and a drain region corresponding to common junction 261-1), a first dual floating diffusion transistor (e.g., DFD gate electrode 235-1, source region 236-1, and a drain region corresponding to common junction 262-1), and a second dual floating diffusion transistor (e.g., DFD gate electrode 235-1, source region 236-2, and a drain region corresponding to common junction 262-2).

It is noted that the second repeat unit 280-2, which is adjacent to the first repeat unit 280-1 includes the same components that may all necessarily be labeled. Accordingly, symmetry occurs along a direction extending between the first repeat unit 280-1 and the second repeat unit 280-2

(e.g., direction or axis 298 which extends along the interface where the first repeat unit 280-1 interfaces with the second repeat unit 280-2. It is appreciated that individual repeat units included in the plurality of repeat units 280 are each mirror symmetric along a direction bisecting a respective one of the individual repeat units. For example, the second repeat unit 280-2 is mirror symmetric about axis 297, which bisects the second repeat unit 280-2 or otherwise extends between the two source-follower gate electrodes (e.g., SF1 gate electrodes 215-2 and SF2 gate electrode 216-2), and through the reset gate electrode (e.g., RST gate electrode 230-2) and optionally the dual floating diffusion gate electrode (e.g., DFD gate electrode 235-2) included in the second repeat unit 280-2. It is appreciated that while the second repeat unit 280-2 has mirror symmetry about axis 297, the second repeat unit 280-2 does not have mirror symmetry about a corresponding axis perpendicular to axis 297. In other words, individual repeat units included in the plurality of repeat units 280 may be mirror symmetry about a first axis or first direction while being asymmetric about a second axis or second direction perpendicular to the first axis or first direction (e.g., the second repeat unit 280-2 is asymmetric about an axis that is perpendicular to the axis 297). However, it is still appreciated that while individual repeat units included in the plurality of repeat units 280 may be respectively mirror symmetric and asymmetric along perpendicular directions or about axis (e.g., mirror symmetric about the y-axis and asymmetric about the x-axis based of coordinate system 300), the regular and repeating arrangement of the plurality of repeat units 280 results in symmetry about both the x-axis and the y-axis of the coordinate system 300 (e.g., symmetry where along directions parallel to the x-axis and the y-axis of the coordinate system 300, such as axis 298, where individual repeat units included in the plurality of repeat units 280 interface with an adjacent repeat unit).

It is appreciated that each repeat unit included in the plurality of repeat units 280 further provides internal routing that would normally occur within the metallization region of at least a metal layer for both intra-coupling within a given 16C pixel cell to couple 4C pixel cells included in the given 16C pixel cell and inter-coupling of adjacent 16C pixel cells by virtue of shared gate electrodes and/or common junctions. For example, the first reset transistor and the second reset transistor of the first repeat unit 280-1 have respective drain regions that correspond to a common junction (e.g., a first common junction corresponding to common junction 261-1) that is also shared by the drain regions of the first source-follower transistor and the second source follower transistor and further coupled to receive a supply voltage (e.g., VDD as illustrated). Accordingly, the drain regions of the first source-follower transistor, the second source-follower transistor, the first reset transistor, and the second reset transistor are each coupled together and further coupled to receive the supply voltage. It is appreciated that formation of said common junction is attributed to oxide or isolation structure defined regions (e.g., isolation structure 229) that defines the location of the common junction 261-1 (as well as other common junctions, source, drain, and active regions of components throughout the illustrated embodiment). In some embodiments, formation of said common junction is attributed to oxide or isolation structure defined regions (e.g., isolation structure 229) that further defines the shape of the common junction. For example, a cross-sectional shape of common junction 261-1 that is shared among the first source-follower transistor, the second source-follower transistor, the first reset transistor, and the second reset transistor are at least in part defined by isolation structure 229. Furthermore, common junction 260-1 (e.g., a second common junction formed in the semiconductor substrate 251) couples the source region of the first source-follower transistor (e.g., source-follower transistor associated with SF1 gate 215-1) with drain regions of two adjacent row select transistors (e.g., row select transistors associated with RS1 gate 225-1 and RS2 gate 226-1). Similarly, common junction 260-2 (e.g., a third common junction formed in the semiconductor substrate 251) couples the source region of the second source-follower transistor (e.g., source-follower transistor associated with SF2 gate 216-1) with drain regions of two adjacent row select transistors (e.g., row select transistors associated with RS1 gate 225-2 and RS2 gate 226-2).

Additionally, internal routing that would normally occur within the metallization region for both intra-coupling within a given 16C pixel cell to couple 4C pixel cells included in the given 16C pixel cell and inter-coupling of adjacent 16C pixel cells is further provided by shared gate electrodes of the pixel cell circuitry 255. In the illustrated embodiment, the row select gate electrodes provide coupling between adjacent 16C-pixel cells (e.g., a common row select signal utilized for readout of the adjacent 16C pixel cells). For example, in the illustrated embodiment RS1 gate electrode 225-1 is coupled to source regions 227-1 (e.g., coupled to bitline N−1 included in a plurality of bitlines) and 227-2 (e.g., coupled to bitline N included in the plurality of bitlines that is different than bitline N) of row select transistors associated with different repeat units included in the plurality of repeat units 280 (e.g., to form first and second transistors that have a common gate electrode with active regions defined by isolation structure 229). A similar configuration is also provided by the RS2 gate electrode 226-1 or 226-2 such that adjacent row select transistors of a given repeat unit included in the plurality of repeat units 280 along a vertical direction (e.g., axis 298) have coupled drain regions that are coupled to a source of a source-follower transistor of the given repeating unit enabling selective binning of image data of multiple 16C cells during readout, and adjacent row select transistors of an adjacent repeat unit included in the plurality of repeat units 280 have their gate electrodes coupled together. In other words, the shared gate electrode (e.g., RS1 gate electrode 225-1, RS2 gate electrode 226-1, RS1 gate electrode 225-2, RS2 gate electrode 226-1, or other row select gate electrodes) corresponds to the gate electrode of two different transistors that are disposed on two different repeat units that are adjacently disposed such as repeat units 280-1 and 280-2. In contrast, intra-coupling within a given 16C pixel cell is provided by shared gate electrodes of the reset transistors and the dual floating diffusion transistors. For example, in the illustrated embodiment RST gate electrode 230-1 is coupled to source regions (e.g., correspond to common junctions 262-1 and 262-2) of reset transistors associated with different 4C pixel cells that are within an individual repeat unit (e.g., repeat unit 280-1) included in the plurality of repeat units 280 (e.g., to form first and second transistors that have a common gate electrode with active regions defined by isolation structure 229). Similarly, in the illustrated embodiment DFD gate electrode 235-1 is coupled to source regions 236-1 and 236-2 of dual floating diffusion transistors associated with different 4C pixel cells that are within an individual repeat unit (e.g., repeat unit 280-1) included in the plurality of repeat units 280 (e.g., to form first and second transistors that have a common gate electrode with active regions defined by isolation structure 229).

In some embodiments, the common junctions corresponding to the source/drain regions of reset and dual floating diffusion transistors (e.g., common junctions 262-1 and 262-2) are respectively coupled to different floating diffusion regions. For example, the common junction 262-1 may be coupled to a first floating diffusion region (e.g., the floating diffusion region 121-1 illustrated in FIG. 1D) while the common junction 262-2 may be coupled to a second floating diffusion region (e.g., the floating diffusion region 121-2 illustrated in FIG. 1D). In the same or other embodiments, the source regions 236-1 and 236-2 may be respectively coupled to the same or different capacitors (e.g., corresponding to FD2 illustrated in FIG. 1F) formed on the second semiconductor substrate 251 or the first semiconductor substrate (e.g., 101 illustrated in FIG. 1A) associated with respective 4C pixel cells.

It is appreciated that in some embodiments, the four row select transistors that are positioned adjacent to one another and associated with two adjacent repeat units included in the plurality of repeat units 280 may be referred to as first, second, third, and fourth row select transistors. For example, the first source region 227-1 may form, in part, a first row select transistor, the second source region 227-2 may form, in part, a second row select transistor, the third source region 228-2 may form, in part, a third row select transistor, and the fourth source region 228-1 may form, in part, a fourth row select transistor. The first row select transistor and the fourth row select transistor may be coupled via their drain regions e.g., share a common drain junction. The second row select transistor and the third row select transistor may be coupled via their respective drain regions e.g., common junction 260-1). Accordingly, the first source region (e.g., 227-1) of the first row select transistor and the second source region (e.g., 227-2) are separated from one another by isolation structure 229. Similarly, the third source region (e.g., 228-2) included in the third row select transistor and a fourth source region (e.g., 228-1) included in a fourth row select transistor are separated from one another by isolation structure 229. In the same or different embodiments, the shared or otherwise coupled drain regions of the first row select transistor and the fourth row select transistor and the shared or otherwise coupled drain regions of the second row select transistor and the third row select transistor are also separated and isolated from one another by isolation structure 229. In some embodiments, the coupled first row select transistor and the fourth row select transistor may be included in a repeat unit included in the plurality of repeat units 280 that is arranged adjacent to the first repeat unit 280-1, and the coupled second row select transistor and the third row select transistor may be included in the first repeat unit 280-1.

It is appreciated that the isolation structure 229 may be segmented such that a first isolation structure (e.g., first portion of the isolation structure 229) is disposed between the first source region (e.g., 227-1) and the second source region (e.g., 227-2) and a second isolation structure (e.g., second portion of the isolation structure 229) is disposed between the third source region (e.g., 228-2) and the fourth source region (e.g., 228-1). A third isolation structure (e.g., third portion of the isolation structure 229) is disposed between shared drain regions (e.g., common junction 260-1) of the second and third row select transistors and the shared drain regions (e.g., common junction 261-1) of the first source-follower transistor (e.g., SF1 gate electrode 215-1.

It is further appreciated that the first isolation structure and the second isolation structure of isolation structure 229 in one embodiment may be structured interconnected isolations structure (e.g., oxide-filled trench isolations structure) disposed to provide isolation between i) the first source region (e.g., 227-1) of the first row select transistor and the second source region (e.g., 227-2) of the second row select transistor, and ii). the third source region (e.g., 228-2) of the third row select transistor and the fourth source region (e.g., 228-1) of the fourth row select transistor. In such an embodiment, RS1 gate electrode 225-1 may be referred to as a first shared gate electrode that is coupled to the first source region (e.g., 227-1) of the first row select transistor and the second source region (e.g., 227-2) while RS2 gate electrode 226-1 may be referred to as a second gate electrode that is coupled to the third source region (e.g., 228-2) included in the third row select transistor and the fourth source region (e.g., 228-1) included in the fourth row select transistor.

In the illustrated embodiment, RS1 gate electrode 225-1 and RS2 gate electrode 226-1 each extend longitudinally (i.e., lengthwise) along parallel directions (e.g., directions parallel to the x-axis of coordinate system 300) when the image sensor is viewed from a plan view. In some embodiments, RS1 gate electrode 225-1 and RS2 gate electrode 226-1 each may be disposed on and extended laterally across respective portions of isolation structure 229. In other words, RS1 gate electrode 225-1 and RS2 gate electrode 226-1 may be positioned parallel to one another. Similarly, the shared reset gate electrode (e.g., RST gate electrode 230-1) and the shared dual floating diffusion gate electrode (e.g., DFD gate electrode 235-1) may each extend longitudinally (i.e., lengthwise) along parallel directions (e.g., directions parallel to the x-axis of coordinate system 300), which may further be parallel to the shared row select gate electrodes (e.g., RS1 gate electrodes 225-1 and 225-2 and RS2 gate electrodes 226-1 and 226-2) as well as parallel to source-follower gate electrodes (e.g., SF1 gate electrode 215-1 and SF2 gate electrode 216-1). However, it is appreciated that in some embodiments the source-follower gate electrodes (e.g., SF1 gate electrode 215-1 and SF2 gate electrode 216-1) of a given repeat unit (e.g., first repeat unit 280-1) included in the plurality of repeat units 280 are aligned along a common direction (e.g., such that a line extending parallel to the x-direction of the coordinate system 300 extends across the entire lengths of both SF1 gate electrode 215-1 and SF2 gate electrode 216-1).

As illustrated in FIG. 2A, gate electrodes of the pixel cell circuitry 255 are arranged along common rows and columns. For example, RS1 gate electrodes 225-4, 225-5, and 225-6 are aligned along a first common direction (e.g., direction 291 parallel to the x-axis of the coordinate system 300) while RS2 gate electrodes 226-4, 226-5, and 226-6 are aligned along a second common direction (e.g., direction 292 parallel to direction 291). Disposed between the first common direction and the second common direction are source follower gate electrodes (e.g., SF1 gate electrodes 215-3, 215-4, 216-3, and 216-4) disposed along a third common (e.g., direction 293 disposed between direction 291 and 292). Conversely, a fourth common direction (e.g., direction 294) may extend through each row select gate of a given column (e.g., RS1 gate electrodes 225-3, 225-6, and 225-9 and RS2 gate electrodes 226-3 and 226-6) in the pixel cell circuitry 255. In some embodiments the fourth common direction is perpendicular to the first, second, and third common directions (i.e., direction 294 is perpendicular to directions 291, 292, and 293). In the same or other embodiments, a fifth common direction (e.g., direction corresponding to axis 297 which is parallel to direction 294) extends through each of the reset gate electrodes (e.g., 230-2 and 230-4) and dual floating diffusion gate electrodes (e.g., 235-2 and 235-4) of a given column in the pixel cell circuitry 255. In some embodiments, the fifth common direction may also include the SF1 gate electrodes (e.g., SF1 gate electrodes 215-2, and 215-4) or the SF2 gate electrodes (e.g., SF gate electrodes 216-2 and 216-4), but not both SF1 and SF2 gate electrodes.

In some embodiments, the pixel cell circuitry 255 can further be described or otherwise segmented into columns (or rows) of row select transistors and ground contact regions (e.g., first segment 285) and columns of source-follower transistors, reset transistors, and optionally dual floating diffusion transistors (e.g., second segment 286). In the illustrated embodiment, the first segment 285 is coupled to the second segment 286 via the corresponding source-follower transistors (e.g., source of source-follower transistors coupled to drains of row select transistors). Instances of the first segment 285 and the second segment 286 may be repeated to form the pixel cell circuitry 255.

The arrangement of components of the pixel cell circuitry 255 is compatible with image sensors submicron pixel pitch, which is provided at least in part by shared components (e.g., shared gate electrodes and/or common junctions) and symmetry (mirror or otherwise) to efficiently utilize the lateral space of the second semiconductor substrate 251. The particular arrangement of components of the pixel cell circuitry 255 further provides reduced fabrication costs by allowing for shared gate electrodes to be utilized for internal routing without the need to additional metal line connections (e.g., reduce the number of metal layers needed during back end of line processing). Further still, the arrangement of components are positioned to facilitate compatibility with foundry design rules such that individual components (e.g., source/drain regions of transistors) may have sizes that are below the critical dimensions set by the design rule requirements of the given technology node. For example, while each individual transistor's required threshold voltage doped region may not meet the foundry's required minimum design dimensions for fabrication, the arrangement of the transistor components allows multiple components to share one threshold voltage doped region meeting the minimum critical dimension. Moreover, implantation for source/drain electrodes may occur after formation of shared gate electrodes such that the gate electrodes may be utilized as self-alignment masks to separate the individual transistor components, while sharing the overall threshold voltage doped region.

Additionally, components are arranged such that lightly doped regions for threshold voltage control may have substantially similar (e.g., within 10% or otherwise based on the manufacturing variance of a given technology node) doping concentrations for adjacent transistors that have the same function (e.g., adjacent source-follower transistors have the same or similar threshold voltage dopant concentration, adjacent row-select transistors have the same or similar threshold voltage dopant concentration that may be different than that of the source-follower transistors threshold voltage dopant concentration and the like). Accordingly, source-follower transistors, row select transistors, reset transistors, and dual floating diffusion transistors of the pixel cell circuitry 255 may have different doping concentrations for threshold voltage control. For example, in the illustrated embodiment a first threshold voltage doped region 271 may be utilized for ion implantation (e.g., before formation of RS1 gate electrode 225-3 and RS2 gate electrode 226-3) to provide substantially equal (e.g., within 10% or otherwise based on manufacturing variance of a given technology node) doping concentrations of dopants to the active regions associated with the row select transistors (e.g., the four row select transistors associated with RS1 gate electrode 225-3 and RS2 gate electrode 226-3). In the same or other embodiments, a second threshold voltage doped region 272 may be utilized for ion implantation (e.g., before formation of SF1 gate electrode 215-4 and SF2 gate electrode 216-4) to provide substantially equal (e.g., within 10% or otherwise based on manufacturing variance of a given technology node) doping concentrations of dopants to the active regions associated with the source-follower transistors (e.g., the two source-follower transistors associated with SF1 gate electrode 215-4 and SF2 gate electrode 216-4). In the same or other embodiments, a third threshold voltage doped region 273 may be utilized for ion implantation (e.g., before formation of RST gate electrode 230-4) to provide substantially equal (e.g., within 10% or otherwise based on manufacturing variance of a given technology node) doping concentrations of dopants to the active regions associated with the reset transistors (e.g., the two reset transistors associated with the shared gate electrode RST gate 230-4). In the same or other embodiments, a fourth threshold voltage doped region 274 may be utilized for ion implantation (e.g., before formation of DFD gate electrode 235-4) to provide substantially equal (e.g., within 10% or otherwise based on manufacturing variance of a given technology node) doping concentrations of dopants to the active regions associated with the dual floating diffusion transistors (e.g., the two dual floating diffusion transistors associated with the shared gate electrode DFD gate 235-4).

Figure 2B:
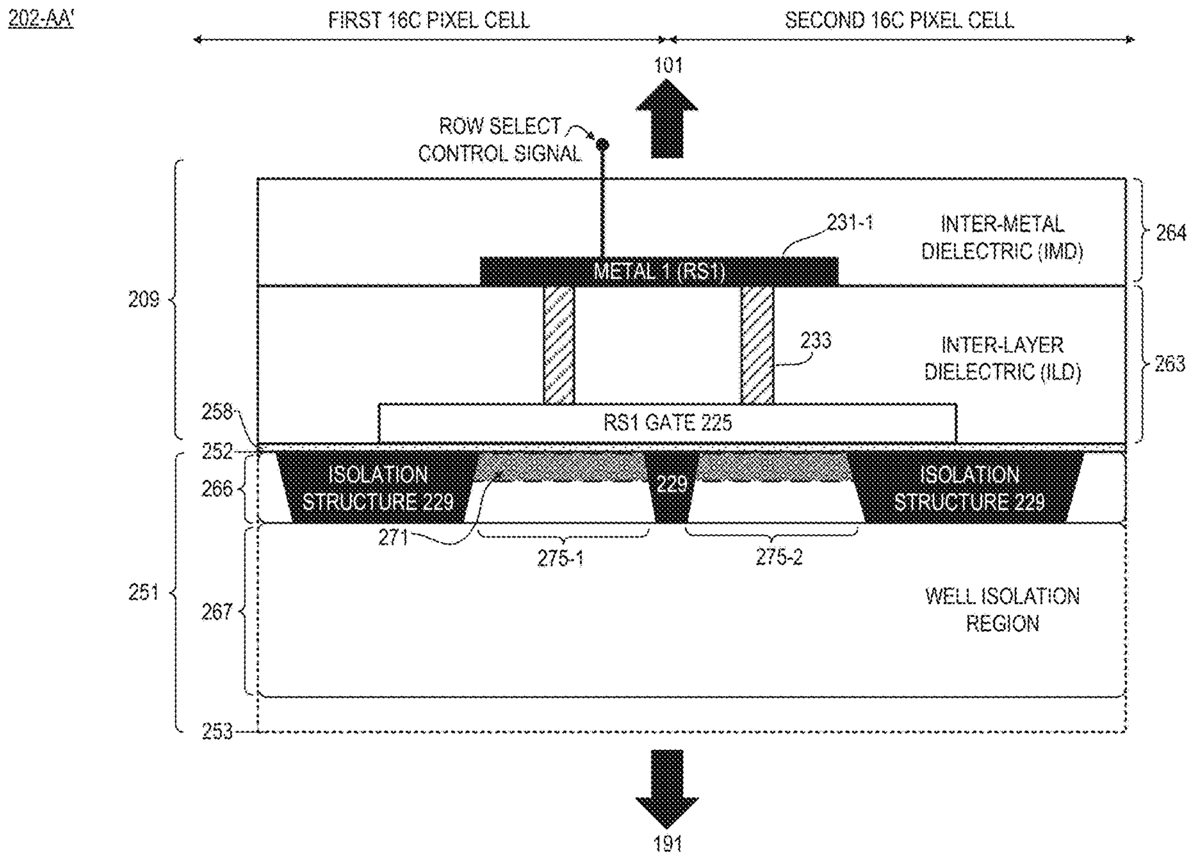
FIG. 2B illustrates a cross-sectional view of the second semiconductor substrate along line A-A' shown in FIG. 2A, in accordance with an embodiment of the disclosure.

FIG. 2B illustrates a cross-sectional view 202-AA' of the second semiconductor substrate 251 along line A-A' shown in FIG. 2A, in accordance with an embodiment of the disclosure. As illustrated, the second semiconductor substrate 251 may be one possible implementation of the second semiconductor substrate 151 and thus may be coupled to the first semiconductor substrate 101 and the third semiconductor substrate 191 as illustrated in FIGS. 1A and 1B. Referring back to FIG. 2B, the cross-sectional view 202-AA' extends across RS1 gate electrode 225-7, but may further be representative of a view extending across any other row select gate electrode included in the pixel cell circuitry 255 of FIG. 2A (e.g., any of the plurality of row select gate electrodes 225 and 226). It is appreciated that the RS1 gate electrode 225 is shared by row select transistors of adjacent 16C pixel cells included in the first semiconductor substrate 101, which is indicated by the arrows indicating the relative alignment and/or associated with overlying 16C pixel cells (e.g., a first 16C pixel cell and a second 16C pixel cell).

In the illustrated embodiment, the second semiconductor substrate 251 includes a first side 252 (e.g., front side or backside) and a second side 253 (e.g., a backside or front side). Disposed between the RS1 gate electrode 225 (e.g., a shared gate electrode that forms two row select transistors with respective active regions 275-1 and 275-2 that are defined at least in part by isolation structure 229) is a gate dielectric 258 (e.g., one or more insulating materials such as silicon dioxide, hafnium oxide, or any other insulating material or combination of insulating materials with appropriate properties to form the two row select transistors). The second semiconductor substrate 251 includes a doped region 266 with a first conductivity type (e.g., N-type or P-type) that may be the same or different than the bulk conductivity type of the second semiconductor substrate 251. The second semiconductor substrate 251 further includes a well isolation region 267 having a second conductivity type opposite the first conductivity type (e.g., P-type or N-type). The doped region 266 may form active regions (e.g., active regions 275-1 and 275-2) of transistors (e.g., the two row select transistors in the illustrated embodiments). In some embodiments, a portion (e.g., first threshold voltage doped region 271) of the doped region 266 proximate to the first side 252 of the second semiconductor substrate 251 may be lightly doped (e.g., N-type or P-type) to provide threshold voltage control of the transistors associated with the underlying gate electrode (e.g., the two row select transistors associated with RS1 gate electrode 225). Accordingly, respective active regions 275-1 and 275-2 included in the two row select transistors include dopants proximate to the first side 252 of the second semiconductor substrate 251 to respectively adjust a threshold voltage of the two row select transistors of the adjacently disposed first and second 16C pixel cells. As illustrated the dopants of the threshold voltage doped region 271 are disposed between the RS1 gate electrode 225 and the second side 253 of the second semiconductor substrate 251. In the illustrated embodiment, the isolation structure 229 is structured to separate the active region 275-1 from the active region 275-2 (e.g., to form two separate active regions and thus two separate row select transistors).

In the illustrated embodiment, the RS1 gate electrode 225 directly contacts the gate dielectric 258 and is formed within inter-layer dielectric (ILD) 263. It is appreciated ILD 263 is closer to the first side 252 of the second semiconductor substrate 251 than any other ILD included in the metallization region 209. In other words, the RS1 gate electrode 225 provides internal routing for the second semiconductor substrate 251 and is disposed closer to the first side 252 than any metal layer (e.g., metal 1, metal 2, and so on) included in the metallization region 209. It is appreciated that the RS1 gate electrode 225 may be formed of polycrystalline silicon or other conductive material or combination of materials with sufficient conductivity to function as a shared gate electrode for the two row select transistors associated with active regions 275-1 and 275-2. The RS1 gate electrode 255 as illustrated is disposed across the area of the first and second 16C pixel cells. For example, RS1 gate electrode 255 may be formed partly on isolation structure 229 (e.g., first isolation structure segment) that is disposed in the semiconductor substrate 251 within a given pixel region associated first 16C pixel cell, and extends over to have part formed on isolation structure 229 (e.g., second isolation structure segment) that is disposed in the semiconductor substrate 251 within a given pixel region associated second 16C pixel cell.

The RS1 gate electrode 225 is coupled to metal wire 231-1 (e.g., a first metallization layer corresponding to a metal 1 layer) via one or more contact vias 233 disposed within ILD 263. Specifically, the contact vias 263 extend from the metal wire 231-1 to the RS1 gate electrode 225 to couple the RS1 gate electrode 225 to the metal wire 231-1. The metal wire 231-1 is disposed within the inter-metal dielectric (IMD) 264, which is further coupled to receive a row select control signal for activating or deactivating the row select transistors associated with the RS1 gate electrode 225 of both first and second 16C pixel cells. As illustrated the ILD 263 is disposed proximate to the first side 252 of the second semiconductor substrate 251. In the illustrated embodiment, the ILD 263 at least partially encapsulates the RS1 gate electrode 225 (e.g., ILD 263 directly contacts RS1 gate electrode 225). In the illustrated embodiment, the ILD 263 is disposed between the IMD 264 and the first side 252 of the second semiconductor substrate 251.

Figure 2C:
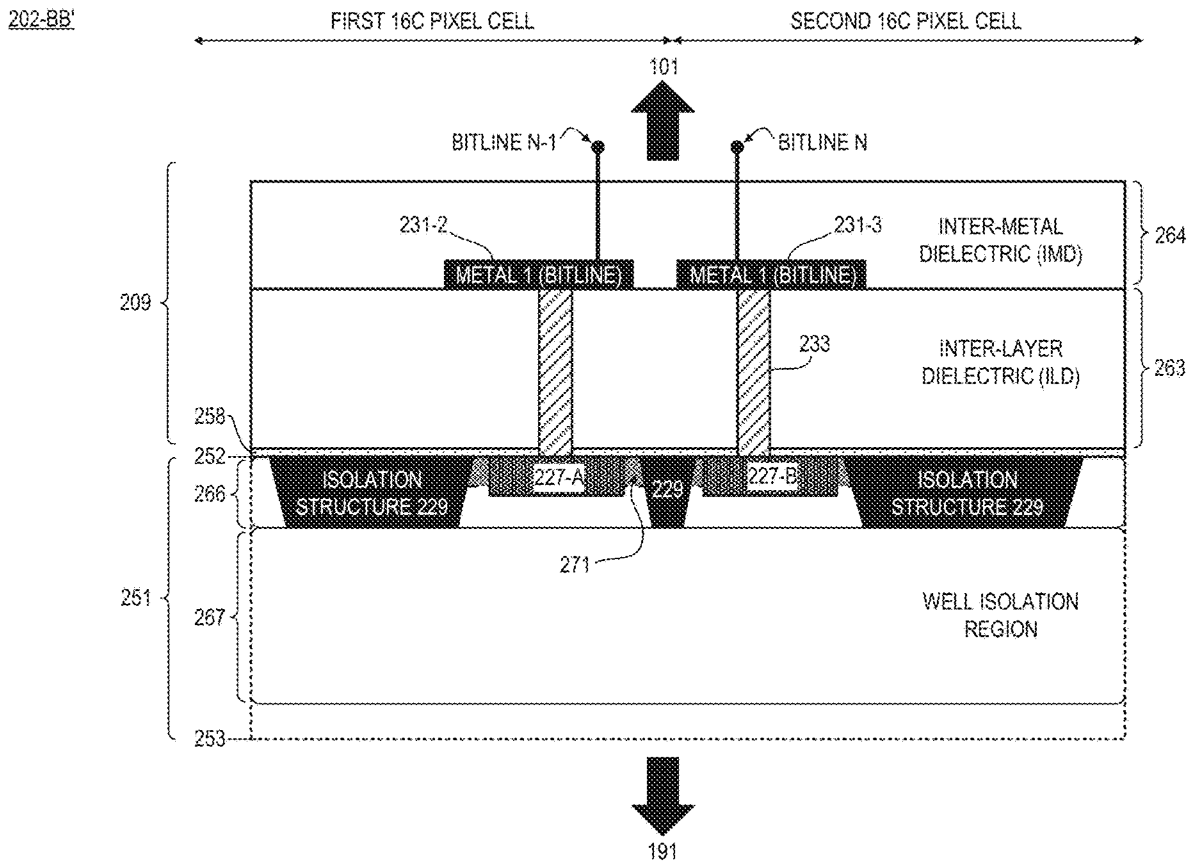
FIG. 2C illustrates a cross-sectional view of the second semiconductor substrate along line B-B' shown in FIG. 2A, in accordance with an embodiment of the disclosure.

FIG. 2C illustrates a cross-sectional view 202-BB' of the second semiconductor substrate 251 along line B-B' shown in FIG. 2A, in accordance with an embodiment of the disclosure. The illustrated cross-sectional view 202-BB' extends across the source regions 227-A and 227-B of the row select transistors illustrated, in part, in FIG. 2B and may further be representative of any similar cross-sectional view across source regions of row select transistors included in the pixel cell circuitry 255 illustrated in FIG. 2A. More specifically, the source regions 227-A and 227-B are disposed within the doped region 266 and may correspond to any adjacent pair of source regions of row select transistors included in the pixel cell circuitry 255 illustrated in FIG. 2A (e.g., source regions 227-1 and 227-2). In some embodiments, the source regions 227-A and 227-B may correspond to heavily doped regions of the first conductivity type (e.g., N+ or P+ doping conductivity type and concentration) to function as source/drain electrodes of the row select transistors. The source regions 227-A and 227-B are respectively coupled to metal wires 231-2 and 231-3 (e.g., the first metallization layer corresponding to the metal 1 layer) via contact vias 233. In the illustrated embodiment, the metal wires 231-2 and 231-3 are coupled to different output bitlines (e.g., bitline N−1 and bitline N, respectively). In the illustrated embodiment, the isolation structure 229 is structured to separate the source region 227-A from the source region 227-B (e.g., to form two separate source regions and thus two separate row select transistors).

Figure 2D:
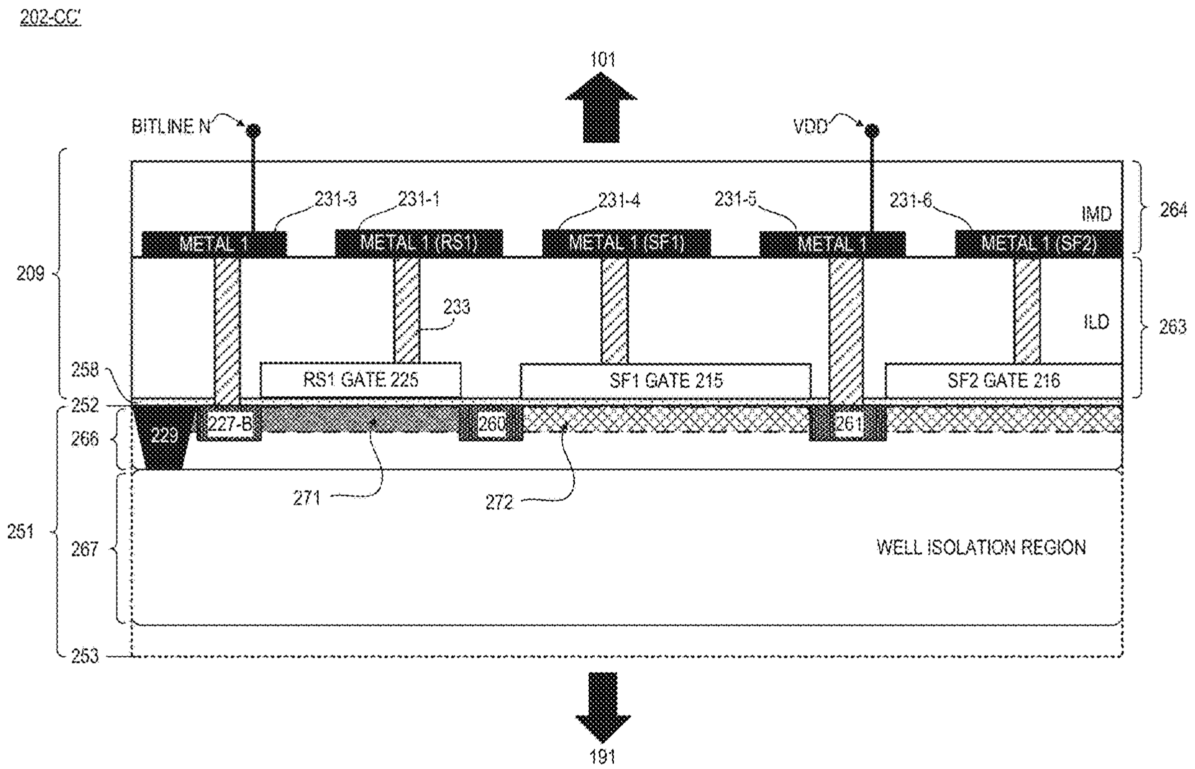
FIG. 2D illustrates a cross-sectional view of the second semiconductor substrate along line C-C' shown in FIG. 2A, in accordance with an embodiment of the disclosure.

FIG. 2D illustrates a cross-sectional view 202-CC' of the second semiconductor substrate 251 along line C-C' shown in FIG. 2A, in accordance with an embodiment of the disclosure. The illustrated cross-sectional view 202-CC' extends across a source region of a row select transistor (e.g., source region 227-4 illustrated in FIG. 2A) through a common junction and further through source-follower transistors gate electrodes (e.g., SF1 gate electrode 215-3 and SF2 gate electrode 216-3) and may further be representative of any similar cross-sectional view across a source region, through a common junction, and further through source-follower gate electrodes included in the pixel cell circuitry 255 illustrated in FIG. 2A.

Referring back to FIG. 2D, it can be seen that common junction 260 corresponds to the drain of the row select transistor associated with RS1 gate electrode 225 and the source of SF1 gate electrode 215. Furthermore, common junction 261 corresponds to drains of the source-follower transistors associated with SF1 gate electrode 215 and SF2 gate electrode 216. The RS1 gate electrode 225, SF1 gate electrode 215, and SF2 gate electrode 216 are each disposed within the ILD 263 proximate to the first side 252 of the second semiconductor substrate 251. In some embodiments, each of the RS1 gate electrode 225, SF1 gate electrode 215, and SF2 gate electrode 216 directly contact gate dielectric 258. More generally, the RS1 gate electrode 225, SF1 gate electrode 215, and SF2 gate electrode 216 provide internal routing and are disposed closer to the first side 252 of the second semiconductor substrate 251 than the first metal layer (e.g., metal 1) disposed in the metallization region 209.

As illustrated in FIG. 2D, the source region 227-B of the row select transistor is coupled to metal wire 231-3, which is further coupled to output bitline N through one or more metal wires. The RS1 gate electrode 225 is coupled to metal wire 231-1 to receive a row select control signal. The metal wire 231-4 is coupled to the SF1 gate electrode 215, which is further coupled to a floating diffusion region (e.g., floating diffusion region 121-1 of FIG. 1D). The metal wire 231-6 is coupled to the SF2 gate electrode 216, which is further coupled to a different floating diffusion region (e.g., floating diffusion region 121-2 of FIG. 1D). The common junction 261 is coupled to receive a supply voltage (e.g., VDD) via metal wire 231-5. It is appreciated that the metal wires 231-1, 231-3, 231-4, 231-5, and 231-6 are coupled to their respective elements (e.g., source/drain regions or gate electrodes) via one or more contact vias disposed within ILD 263. In the illustrated embodiment it is further noted that the active regions of the row select and source-follower transistors have been lightly doped to provide threshold voltage control as indicated by the first threshold voltage doped region 271 and the second threshold voltage doped region 272 with dopants formed within the doped region 266 proximate to the first side 252 of the second semiconductor substrate 251.

Figure 2E:
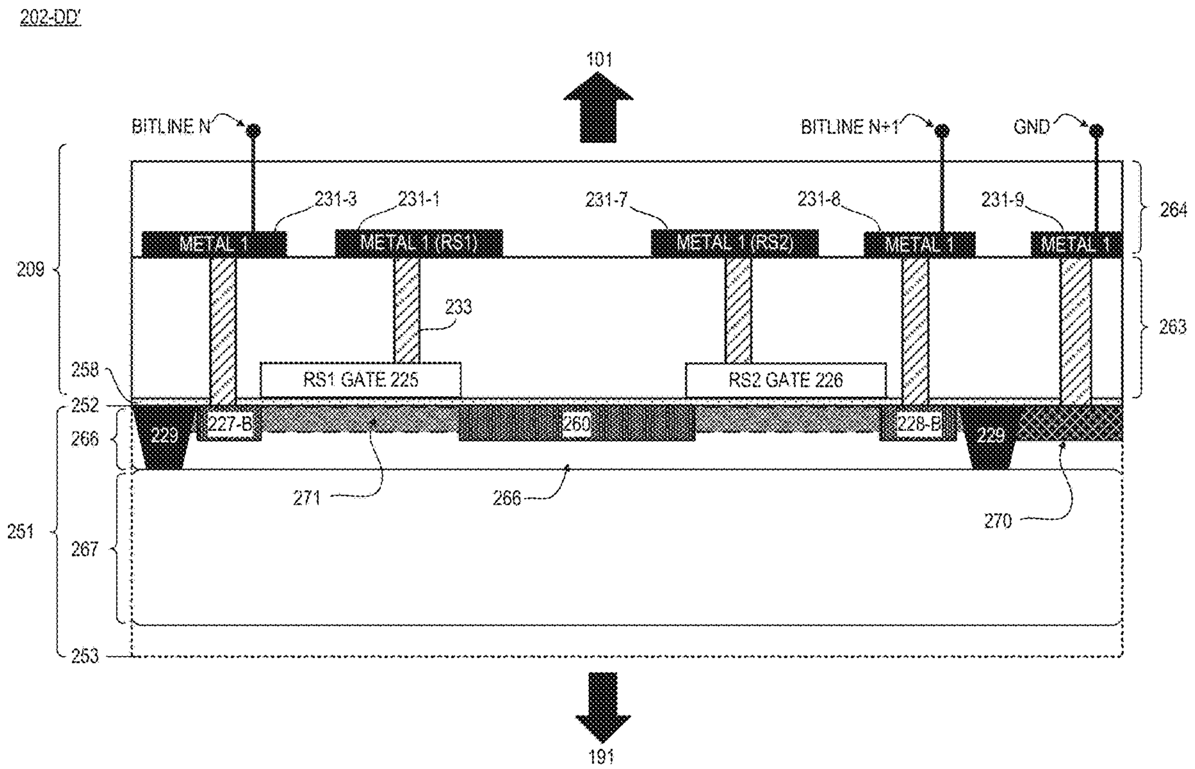
FIG. 2E illustrates a cross-sectional view of the second semiconductor substrate along line D-D' shown in FIG. 2A, in accordance with an embodiment of the disclosure.

FIG. 2E illustrates a cross-sectional view DD' of the second semiconductor substrate 251 along line D-D' shown in FIG. 2A, in accordance with an embodiment of the disclosure. The illustrated cross-sectional view 202-DD' extends across two row select transistors included in the pixel cell circuitry 255 that have drain regions coupled together (e.g., corresponding to a common junction) and may further be representative of any similar cross-sectional view that extends through two row select transistors having drain regions coupled together included in the pixel cell circuitry 255 illustrated in FIG. 2A.

Referring back to FIG. 2E, it can be seen that common junction 260 corresponds to the drain of the row select transistor associated with RS1 gate electrode 225 and RS2 gate electrode 226. It is further appreciated that source region 227-B of the row select transistor associated with RS1 gate electrode 225 and source region 228-B of the row select transistor associated with RS2 gate electrode 266 are respective coupled through metal wire 231-3 and metal wire 231-8 to different output bitlines (e.g., bitline N and bitline N+1, respectively). As discussed previously the RS1 gate electrode 225 and the RS2 gate electrode 226 are respectively coupled via metal wire 231-1 and metal wire 231-7 to receive respective row select control line signals (e.g., RS1 and RS2). The ground region 270 formed in the second semiconductor substrate 251 (e.g., a doped region of the semiconductor substrate of the second conductivity type opposite of the first conductivity type of the doped region 266) is coupled to ground via metal wire 231-9. It is further noted that isolation structure 229 extends to be disposed between the ground region 270 and the source region 228-B.

As illustrated in FIG. 2E, RS1 gate electrode 225 and RS2 gate electrode 226 are each disposed within ILD 263 proximate to the first side 252 of the second semiconductor substrate 251. In some embodiments, each of the RS1 gate electrode 225 and RS2 gate electrode 226 directly contact gate dielectric 258. More generally, the RS1 gate electrode 225 and the RS2 gate electrode 226 provide internal routing and are disposed closer to the first side 252 of the second semiconductor substrate than the first metal layer (e.g., metal 1) disposed in the metallization region 209.

Figure 2F:
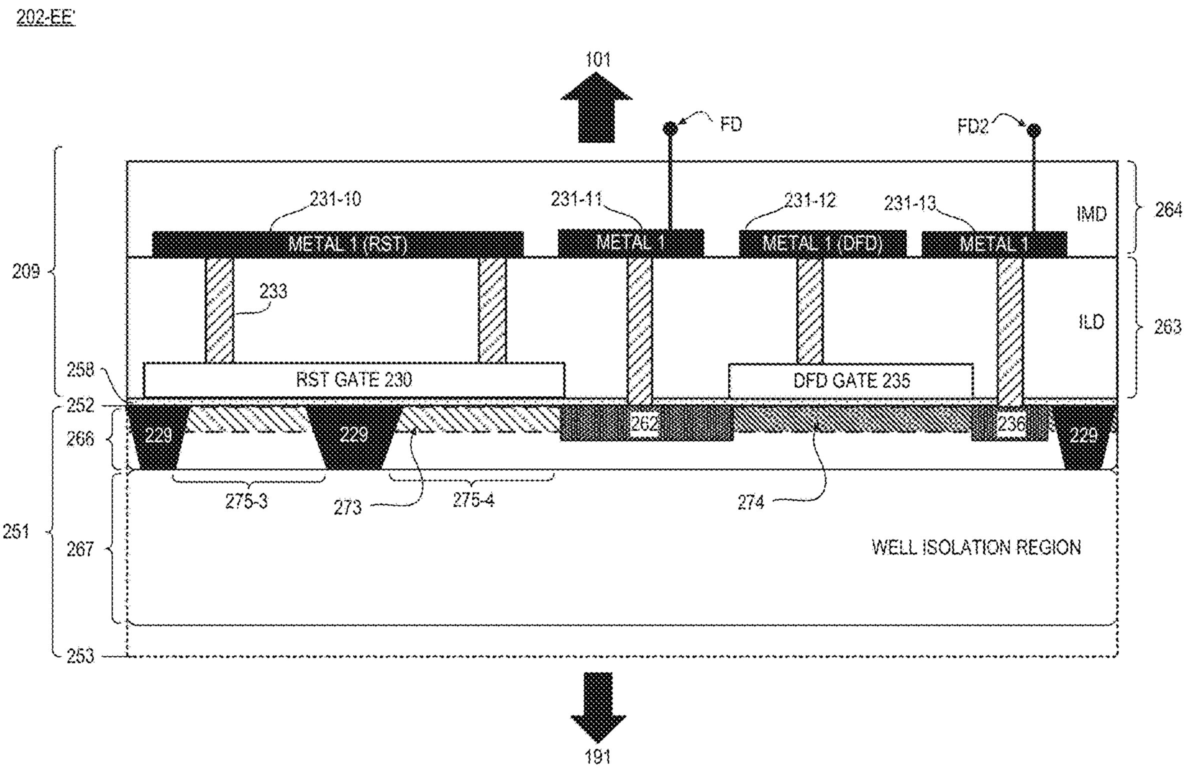
FIG. 2F illustrates a cross-sectional view of the second semiconductor substrate along line E-E' shown in FIG. 2A, in accordance with an embodiment of the disclosure.

FIG. 2F illustrates a cross-sectional view 202-EE' of the second semiconductor substrate 251 along line E-E' shown in FIG. 2A, in accordance with an embodiment of the disclosure. The illustrated cross-sectional view 202-EE' extends across a gate electrode shared by two reset transistors (e.g., any of the plurality of reset gate electrodes 230) and further extends across an adjacent dual floating diffusion gate electrode (e.g., any of the plurality of dual floating diffusion gate electrodes 235) and may further be representative of any similar cross-sectional view across a gate electrode shared by two reset transistors and an adjacent dual floating diffusion gate electrode included in the pixel cell circuitry 255 illustrated in FIG. 2A.

Referring to FIG. 2F, it can be seen that isolation structure 229 separates active regions 275-3 and 275-4, which form the two reset transistors sharing RST gate electrode 230. Furthermore, common junction 262 corresponds to the source of the reset transistor associated with the active region 275-4 and the drain of the dual floating diffusion transistor associated with DFD gate electrode 235. As illustrated, RST gate electrode 230 and DFD gate electrode 235 are disposed within ILD 263 proximate to the first side 252 of the second semiconductor substrate 251. In some embodiments, RST gate electrode 230 and DFD gate electrode 235 directly contact gate dielectric 258. More generally, RST gate electrode 230 and DFD gate electrode 235 provide internal routing and are disposed closer to the first side 252 of the semiconductor substrate 251 than the first metal layer (e.g., metal 1) disposed in the metallization region 209.

As illustrated in FIG. 2F, RST gate electrode 230 is coupled to receive a reset control signal (RST) via metal wire 231-10. The common junction 262 is coupled to a floating diffusion region (e.g., floating diffusion region 121-2 illustrated in FIG. 1D) via metal wire 231-11. DFD gate electrode 235 is coupled to reset a dual floating diffusion control signal (DFD) via metal wire 231-12. The source region of the dual floating diffusion transistor associated with DFD gate 235 is coupled to a different or additional floating diffusion region (e.g., FD2) to modulate a conversion gain for the given pixel cell circuitry 255 disposed within the second semiconductor substrate 251 or the first semiconductor substrate 101. It is appreciated that the metal wires 231-10, 231-11, 231-12, and 231-13 are coupled to their respective elements (e.g., source/drain regions or gate electrodes) via one or more contact vias disposed within ILD 263. In the illustrated embodiment it is further noted that the active regions of the reset and dual floating diffusion transistors have been lightly doped to provide threshold voltage control as indicated by the third threshold voltage doped region 273 and the fourth threshold voltage doped region 274 with dopants formed within the doped region 266 proximate to the first side 252 of the second semiconductor substrate 251.

Embodiments of the disclosure illustrated in at least FIGS. 1A-2F may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:

a semiconductor substrate including a first side and a second side opposite the first side;

a first source region and a second source region, each disposed within the semiconductor substrate proximate to the first side, wherein the first source region is separated from the second source region by an isolation structure disposed within the semiconductor substrate between the first source region and the second source region;

a shared gate electrode disposed proximate to the first side of the semiconductor substrate and coupled to the first source region and the second source region to respectively form a first row select transistor and a second row select transistor;

a plurality of bitlines including a first bitline and a second bitline different from the first bitline, wherein the first source region of the first row select transistor is coupled to the first bitline, and wherein the second source region of the second row select transistor is coupled to the second bitline; and a common junction formed in the semiconductor substrate to couple the second row select transistor to a source-follower transistor and a third row select transistor, wherein the common junction corresponds to drain regions of the second row select transistor and the third row select transistor, and wherein the common junction further corresponds to a source region of the source-follower transistor.

2. The image sensor of claim 1, wherein respective active regions included in the first row select transistor and the second row select transistor include dopants disposed proximate to the first side of the semiconductor substrate to respectively adjust a threshold voltage of the first row select transistor and the second row select transistor, and wherein the dopants included in the active regions are further disposed between the shared gate electrode and the second side of the semiconductor substrate.

3. The image sensor of claim 2, wherein the active regions include a first active region of the first row select transistor and a second active region of the second row select transistor, and wherein the isolation structure extends to be disposed between the first active region and the second active region, and wherein a first doping concentration of the dopants within the first active region is substantially equal to a second doping concentration of the dopants within the second active region.

4. The image sensor of claim 1, further comprising a gate dielectric disposed between the shared gate electrode and the first side of the semiconductor substrate, and wherein the shared gate electrode directly contacts the gate dielectric.

5. The image sensor of claim 1, further comprising:

an interlayer dielectric (ILD) disposed proximate to the first side of the semiconductor substrate, wherein the ILD at least partially encapsulates the shared gate electrode;

a first intermetal dielectric (IMD), wherein the ILD is disposed between the first IMD and the first side of the semiconductor substrate; and a first metallization layer disposed within the first IMD, wherein the first metallization layer includes a first metal wire coupled to the shared gate electrode by a via extending from the first metal wire to the shared gate electrode through the ILD.

6. The image sensor of claim 1, further comprising:

a third source region included in the third row select transistor and a fourth source region included in a fourth row select transistor, each disposed within the semiconductor substrate proximate to the first side, wherein a second isolation structure is disposed within the semiconductor substrate between the third source region and the fourth source region; and a second shared gate electrode included in the third row select transistor and the fourth row select transistor, the second shared gate electrode disposed proximate to the first side of the semiconductor substrate and coupled to the third source region of the third row select transistor and the fourth source region of the fourth row select transistor.

7. The image sensor of claim 1, further comprising:

a second shared gate electrode to couple the third row select transistor and a fourth row select transistor; and a source-follower gate electrode included in the source-follower transistor.

8. The image sensor of claim 1, wherein the semiconductor substrate corresponds to a transistor substrate having pixel cell circuitry, including the first transistor and the second transistor, for readout of a plurality of pixel cells, wherein the pixel cell circuitry includes a plurality of repeat units formed in or on the semiconductor substrate, wherein individual repeat units included in the plurality of repeat units each include respective instances of the first row select transistor and the second row select transistor, and wherein the plurality of repeat units do not include any photodiodes.

9. The image sensor of claim 8, wherein the plurality of repeat units includes a first repeat unit and a second repeat unit adjacent to the first repeat unit, and wherein symmetry occurs about an axis extending between the first repeat unit and the second repeat unit.

10. The image sensor of claim 8, wherein the individual repeat units included in the plurality of repeat units are each mirror symmetric about an axis bisecting a respective one of the individual repeat units.

11. An image sensor, comprising:

a semiconductor substrate including a first side and a second side opposite the first side;

a first source region and a second source region, each disposed within the semiconductor substrate proximate to the first side, wherein the first source region is separated from the second source region by an isolation structure disposed within the semiconductor substrate between the first source region and the second source region; and a shared gate electrode disposed proximate to the first side of the semiconductor substrate and coupled to the first source region and the second source region to respectively form a first transistor and a second transistor, wherein the first transistor corresponds to a first reset transistor and the second transistor corresponds to a second reset transistor, and wherein respective drain regions included in the first reset transistor and the second reset transistor correspond to a common junction formed in the semiconductor substrate such that the respective drain regions of the first reset transistor and the second reset transistor are coupled together.

12. The image sensor of claim 11, further comprising a first source-follower gate and a second source-follower gate, each disposed proximate to the first side of the semiconductor substrate and coupled to the common junction to respectively form a first source-follower transistor and a second source-follower transistor.

13. The image sensor of claim 11, further comprising a sensor substrate including at least a first pixel cell, wherein the first pixel cell includes a first floating diffusion region, wherein the semiconductor substrate corresponds to a transistor substrate coupled to the sensor substrate, and wherein the first source region of the first reset transistor of the transistor substrate is coupled to the first floating diffusion region included in the first pixel cell of the sensor substrate.

14. The image sensor of claim 11, wherein the first reset transistor and the second reset transistor are associated with a same pixel cell.

15. The image sensor of claim 11, further comprising a second shared gate electrode disposed proximate to the first side of the semiconductor substrate and coupled to the first source region and the second source region to respectively form a third transistor and a fourth transistor, and wherein the first shared gate electrode and the second shared gate electrode are aligned along a common direction that is perpendicular to a longest edge of the first shared gate electrode.

16. An image sensor, comprising:

a semiconductor substrate including a first side and a second side opposite the first side;

a first source/drain region and a second source/drain region, each disposed within the semiconductor substrate proximate to the first side, wherein the first source/drain region is separated from the second source/drain region by an isolation structure disposed within the semiconductor substrate between the first source/drain region and the second source/drain region;

a first shared gate electrode disposed proximate to the first side of the semiconductor substrate and coupled to the first source/drain region and the second source/drain region to respectively form a first transistor and a second transistor; and a second shared gate electrode disposed proximate to the first side of the semiconductor substrate and coupled to the first source/drain region and the second source/drain region to respectively form a third transistor and a fourth transistor, and wherein the first transistor and the second transistor respectively correspond to a first dual floating diffusion (DFD) transistor and a second DFD transistor.

17. The image sensor of claim 16, wherein the first source/drain region of the first transistor and the second source/drain region of the second transistor are coupled to a shared floating diffusion region or different floating diffusion regions.

18. The image sensor of claim 1, further comprising a second shared gate electrode included in the third row select transistor and a fourth row select transistor, wherein the shared gate electrode and the second shared gate electrode are aligned along a common direction that is perpendicular to a longest edge of the first shared gate electrode.

* * * * *